US011664386B2

(12) United States Patent
Moon et al.

(10) Patent No.: US 11,664,386 B2
(45) Date of Patent: May 30, 2023

(54) DISPLAY DEVICE AND METHOD OF FABRICATING THE SAME

(71) Applicant: Samsung Display Co., Ltd., Yongin-si (KR)

(72) Inventors: Yeon Keon Moon, Hwaseong-si (KR); Tae Sang Kim, Seoul (KR); Joon Seok Park, Yongin-si (KR); Myoung Hwa Kim, Seoul (KR); Hyung Jun Kim, Seoul (KR); Sang Woo Sohn, Yongin-si (KR); Hye Lim Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 266 days.

(21) Appl. No.: 16/906,948

(22) Filed: Jun. 19, 2020

(65) Prior Publication Data

US 2021/0111197 A1    Apr. 15, 2021

(30) Foreign Application Priority Data

Oct. 11, 2019    (KR) .......................... 10-2019-0125912

(51) Int. Cl.
*H01L 27/14*    (2006.01)
*H01L 27/12*    (2006.01)

(52) U.S. Cl.
CPC ........ *H01L 27/1237* (2013.01); *H01L 27/124* (2013.01); *H01L 27/1225* (2013.01); *H01L 27/1255* (2013.01); *H01L 27/1259* (2013.01)

(58) Field of Classification Search
CPC ............ H01L 27/1237; H01L 27/1225; H01L 27/124; H01L 27/1255; H01L 27/1259

USPC ............................................... 257/59, 71, 72
See application file for complete search history.

(56) References Cited

U.S. PATENT DOCUMENTS 10,340,320 B2 * 7/2019 Lee ..................... H01L 27/1248
10,672,802 B2 * 6/2020 Lee ..................... H01L 27/3276
2017/0294456 A1 10/2017 Lee et al.

FOREIGN PATENT DOCUMENTS

JP          2015060996       * 3/2015
KR   10-2013-0074980 A      7/2013
KR   10-2018-0030275 A      3/2018

OTHER PUBLICATIONS

Chen, Rongsheng et al.; "Self-aligned top-gate InGaZnO thin film transistors using $SiO_2/AL_2O_3$ stack gate dielectric"; Thin Solid Films; 548; 2013; pp. 572-575.

* cited by examiner

Primary Examiner — Tan N Tran
(74) Attorney, Agent, or Firm — Lewis Roca Rothgerber Christie LLP

(57) ABSTRACT

A display device includes: a substrate; a first active layer of a first transistor and a second active layer of a second transistor on the substrate; a first gate insulating layer on the first active layer; a first gate electrode on the first gate insulating layer; a second gate insulating layer on the second active layer; and a second gate electrode on the second gate insulating layer, wherein a hydrogen concentration of the first gate insulating layer is lower than a hydrogen concentration of the second gate insulating layer.

22 Claims, 24 Drawing Sheets

|    | ION (15V) | IOFF (0V) | Mobility (Cm²/VXS) | DR (V) | Vth (10nA) |
|----|-----------|-----------|--------------------|--------|------------|
| T2 | $1.78 \times 10^{-5}$A | $5.75 \times 10^{-11}$A | 12.49 | 1.88 | 0.30 |
| T1 | $7.58 \times 10^{-6}$A | $4.61 \times 10^{-11}$A | 4.04 | 3.12 | 0.54 |

FIG. 8

|  | ION (15V) | IOFF (0V) | Mobility ($Cm^2/VXS$) | DR (V) | Vth (10nA) |
|---|---|---|---|---|---|
| T1 | $6.33 \times 10^{-6}$A | $2.54 \times 10^{-13}$A | 3.20 | 3.54 | 1.07 |

DISPLAY DEVICE AND METHOD OF FABRICATING THE SAME

CROSS-REFERENCE TO RELATED APPLICATION

The present application claims priority to and the benefit of Korean Patent Application No. 10-2019-0125912 filed on Oct. 11, 2019, in the Korean Intellectual Property Office, the entire content of which is incorporated herein by reference.

BACKGROUND

1. Field

Aspects of some example embodiments of the present disclosure relate to a display device and a method for fabricating the same.

2. Description of the Related Art

As the information-oriented society evolves, display devices may be more frequently utilized to display images and information. Accordingly, recent display devices include liquid-crystal displays (LCDs), plasma display panels (PDPs), organic light-emitting displays (OLEDs), micro light-emitting diode displays, etc.

The pixels of an organic light-emitting display device or a micro light-emitting diode display device may include a light-emitting diode, a first transistor for adjusting the amount of driving current supplied from a first supply voltage line to the light-emitting element according to a voltage of the gate electrode, and a scan transistor for applying a data voltage from a data line to the gate electrode of the first transistor in response to a scan signal from a scan line.

The driving voltage of the first transistor refers to the voltage applied to the gate electrode of the first transistor to allow the driving current to flow. The driving voltage range of the first transistor refers to a voltage range from a first voltage that allows a minimum driving current (e.g., a set or predetermined minimum driving current) to flow to a second voltage that allows a maximum driving current (e.g., a predetermined maximum driving current) to flow.

The driving voltage range of the first transistor can be widened by increasing the channel length of the first transistor. However, if the channel length of the first transistor is increased, the size of the first transistor may also be increased, such that the size of the pixels may be increased. As the size of pixels increases, it may be difficult to realize a high resolution display device and a high pixel per inch (PPI) display device.

The above information disclosed in this Background section is only for enhancement of understanding of the background and therefore the information discussed in this Background section does not necessarily constitute prior art.

SUMMARY

Aspects of some example embodiments of the present disclosure are directed to a display device capable of increasing a driving voltage range of a first transistor of each of the pixels.

Aspects of some example embodiments of the present disclosure are also directed to a method of fabricating a display device capable of increasing a driving voltage range of a first transistor of each of the pixels.

However, example embodiments of the present disclosure are not restricted to those set forth herein. The above and other aspects of some example embodiments of the present disclosure will become more apparent to one of ordinary skill in the art to which the present disclosure pertains by referencing the detailed description of the present disclosure given below.

According to some example embodiments of the present disclosure, a display device includes: a substrate; a first active layer of a first transistor and a second active layer of a second transistor on the substrate; a first gate insulating layer on the first active layer; a first gate electrode on the first gate insulating layer; a second gate insulating layer on the second active layer; and a second gate electrode on the second gate insulating layer. A hydrogen concentration of the first gate insulating layer is lower than a hydrogen concentration of the second gate insulating layer.

According to some example embodiments of the present disclosure, there is provided a display device comprising: a plurality of pixels connected to scan lines and data lines intersecting the scan lines. Each of pixels comprises a light-emitting element, a first transistor for controlling a driving current flowing to the light-emitting element according to a data voltage applied to a gate electrode thereof, and a second transistor that is turned on by a scan signal from a scan signal to apply a data voltage from the data line to the gate electrode of the first transistor. A driving voltage range of the first transistor is wider than a driving voltage range of the second transistor.

According to some example embodiments of the present disclosure, in a method of fabricating a display device, the method includes: forming a first active layer of a first transistor and a second active layer of a second transistor on a substrate; forming a first gate insulating layer on a first channel region of the first active layer, and a first gate electrode of the first transistor on the first gate insulating layer, the first gate electrode overlapping the first channel region in a first direction that is a thickness direction of the substrate; and forming a second gate insulating layer on a second channel region of the second active layer, and a second gate electrode of the second transistor on the second gate insulating layer, the second gate electrode overlapping the second channel region in the first direction. A hydrogen concentration of the first gate insulating layer is lower than a hydrogen concentration of the second gate insulating layer.

According to the aforementioned and other example embodiments of the present disclosure, the hydrogen concentration of a first gate insulating layer between a first active layer and a first gate electrode of a first transistor may be lower than the hydrogen concentration of a second gate insulating layer between a second active layer and a second gate electrode of a second transistor. The lower the hydrogen concentration of the first gate insulating layer is, the more electron traps by oxygen interstitial of the first gate insulating layer may be created. As a result, the driving voltage range of the first transistor can be widened.

In addition, the minimum thickness of the first gate insulating layer may be greater than the minimum thickness of the second gate insulating layer. As a result, the distance between the first gate electrode and the first active layer is increased, and thus the driving voltage range of the first transistor can be widened.

Other aspects and characteristics of some example embodiments may be more apparent from the following detailed description, the drawings, and the claims.

BRIEF DESCRIPTION OF THE DRAWINGS

The above and other aspects of some example embodiments according to the present disclosure will become more apparent by describing in more detail example embodiments thereof with reference to the attached drawings, in which:

FIG. 8 is a table showing the driving current flowing at the turn-on voltage, the driving current flowing at the turn-off voltage, the electron mobility and the driving voltage range of the first transistor.

DETAILED DESCRIPTION

Further details of some example embodiments of the present disclosure will now be described more fully hereinafter with reference to the accompanying drawings, in which some example embodiments of the disclosure are shown. Embodiments according to the present disclosure may, however, be embodied in different forms and should not be construed as being limited to the example embodiments set forth herein. Rather, these example embodiments are provided so that this disclosure will be more thorough and more complete, and will more fully convey the scope of embodiments according to the disclosure to those skilled in the art. The same reference numbers indicate the same components throughout the specification. In the attached figures, the thickness of layers and regions is exaggerated for clarity.

Hereinafter, aspects of some example embodiments of the present disclosure will be described with reference to the attached drawings.

Figure 1:
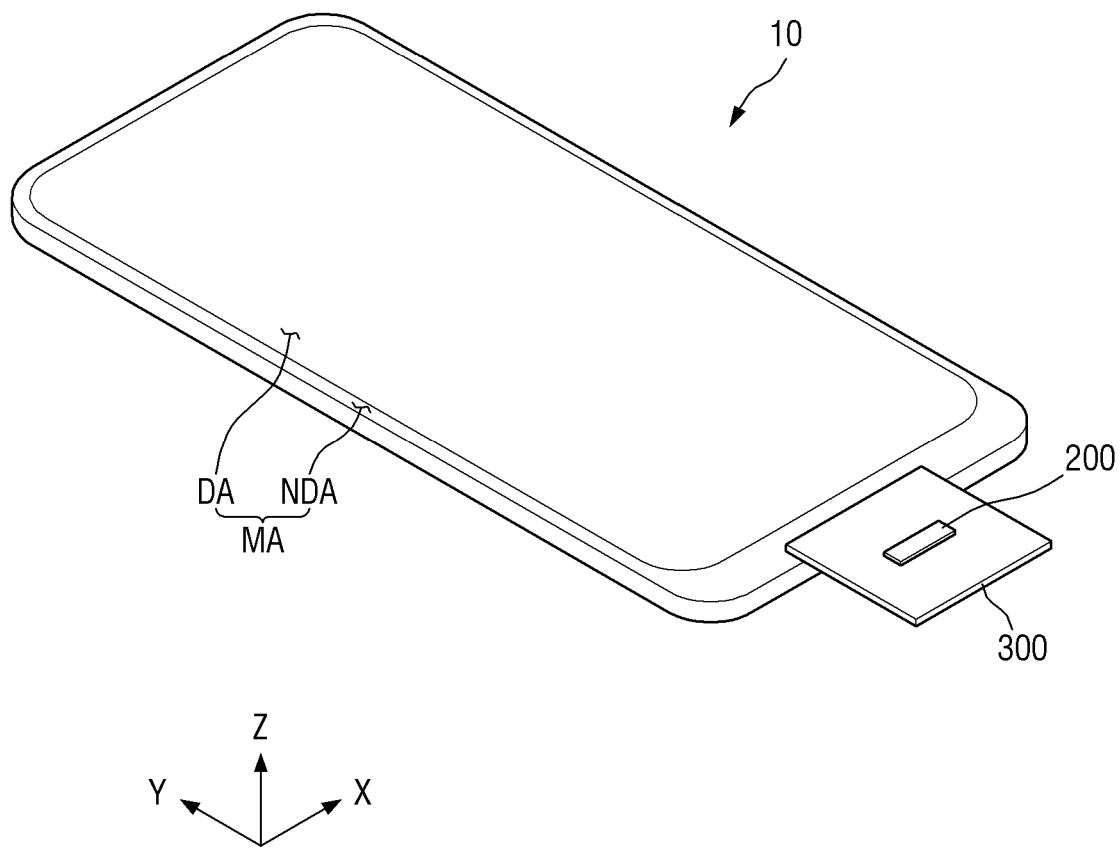
FIG. 1 is a perspective view of a display device according to some example embodiments of the present disclosure.
Figure 2:
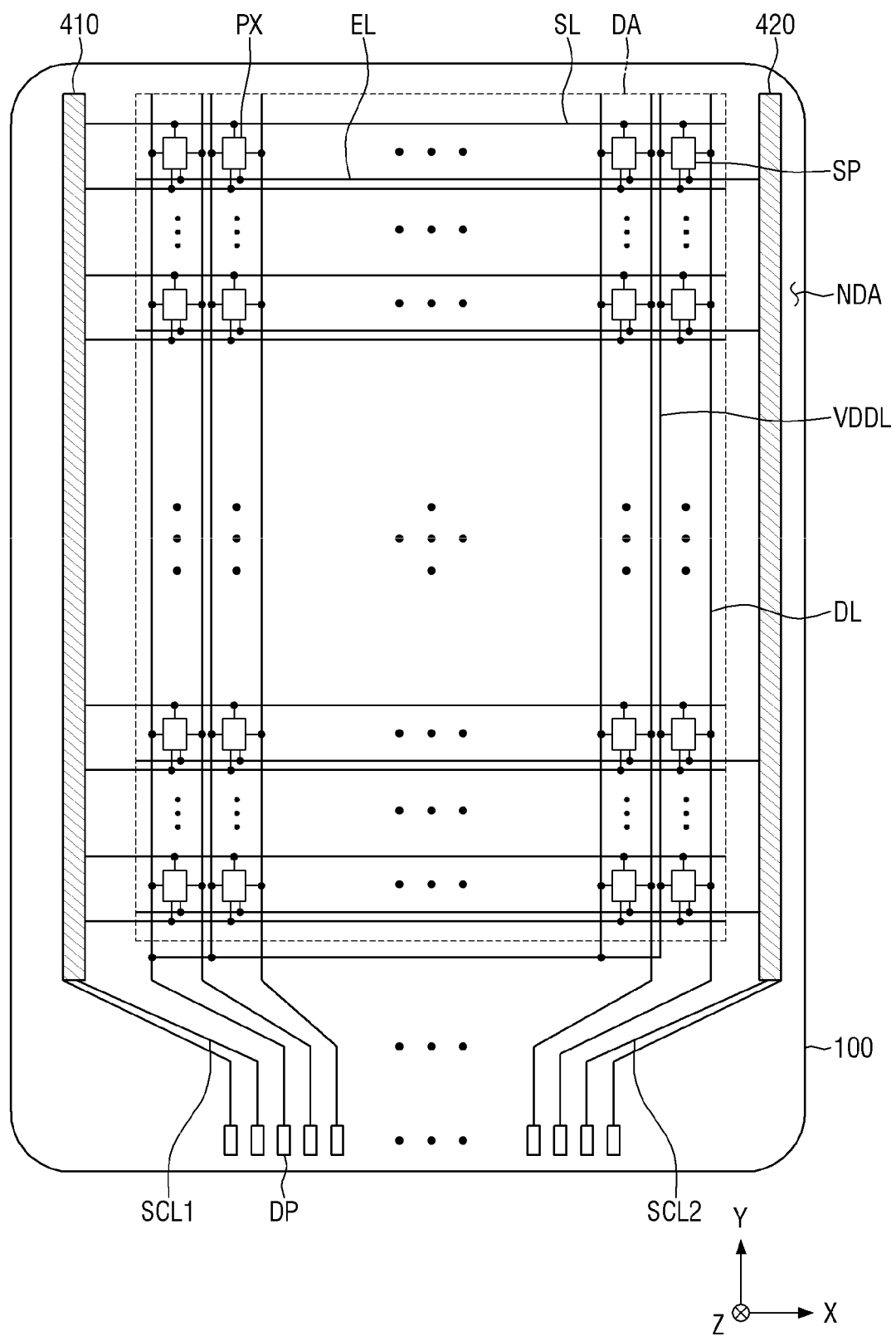
FIG. 2 is a plan view showing an example of a display panel according to some example embodiments of the present disclosure.

FIG. 1 is a perspective view of a display device according to some example embodiments of the present disclosure. FIG. 2 is a plan view showing an example of a display panel according to some example embodiments of the present disclosure.

As used herein, the terms "above," "top" and "upper surface" refer to the upper side of the display panel 100, i.e., the side indicated by the arrow in the z-axis direction, whereas the terms "below," "bottom" and "lower surface" refer to the lower side of the display panel 100, i.e., the opposite side in the z-axis direction. As used herein, the terms "left," "right," "upper" and "lower" sides indicate relative positions when the display panel 100 is viewed from the top. For example, the "left side" refers to the opposite direction indicated by the arrow of the x-axis, the "right side" refers to the direction indicated by the arrow of the x-axis, the "upper side" refers to the direction indicated by the arrow of the y-axis, and the "lower side" refers to the opposite direction indicated by the arrow of the y-axis.

A display device 10 is for displaying moving images or still images. The display device 1 may be used as the display screen of portable electronic devices such as a mobile phone, a smart phone, a tablet PC, a smart watch, a watch phone, a mobile communications terminal, an electronic notebook, an electronic book, a portable multimedia player (PMP), a navigation device and a ultra mobile PC (UMPC), as well as the display screen of various products such as a television, a notebook, a monitor, a billboard and the Internet of Things.

The display device 10 may be one of an organic light-emitting display device, a liquid-crystal display device, a plasma display device, a field emission display device, an electrophoretic display device, an electrowetting display device, a quantum dot light-emitting display device, a micro LED display device and the like. In the following description, an organic light-emitting display device is described as an example of the display device 10. It is, however, to be understood that embodiments according to the present disclosure are not limited thereto.

Referring to FIGS. 1 and 2, the display device 10 according to some example embodiments includes a display panel 100, a display driver 200, and a circuit board 300.

The display panel 100 may be formed in a rectangular plane having shorter sides in a first direction (x-axis direction) and longer sides in a second direction (y-axis direction) intersecting the first direction (x-axis direction). Each of the corners where the short side in the first direction (x-axis direction) meets the longer side in the second direction (y-axis direction) may be rounded with a curvature (e.g., a set or predetermined curvature) or may be a right angle.

The shape of the display panel 100 when viewed from the top is not limited to a quadrangular shape, but may be formed in a different polygonal shape, a circular shape, or an elliptical shape. The display panel 100 may be, but is not limited to being, formed to be flat. For example, the display panel 10 may include curved portions formed at left and right ends thereof and having a constant or varying curvature. In addition, the display panel 100 may be formed to be flexible so that it can be curved, bent, folded or rolled.

The display panel 100 may include a display area DA where sub-pixels PX are formed to display images, and a non-display area NDA, which is the peripheral area of the display area DA. When the display panel 100 includes a curved portion, the display area DA may be arranged on the curved portion. In such case, images of the display panel 100 can also be seen on the curved portion.

In the display area DA, scan lines SL, emission lines EL, data lines DL and first supply voltage lines VDDL connected to the sub-pixels PX may be arranged, in addition to the sub-pixels PX. The scan lines SL and the emission lines EL may be arranged in the first direction (x-axis direction), while the data lines DL may be arranged in the second direction (y-axis direction) intersecting the first direction (x-axis direction). The first supply voltage lines VDDL may be arranged in parallel in the second direction (y-axis direction) in the display area DA. The first supply voltage lines VDDL formed in parallel in the second direction (y-axis direction) in the display area DA may be connected to one another in the non-display area NDA.

Each of the sub-pixels PX may be connected to at least one of the scan lines SL, at least one of the data lines DL, at least one of the emission lines EL, and at least one of the first supply voltage lines VDDL. In the example shown in FIG. 2, each of the sub-pixels PX is connected to two scan lines SL, one data line DL, one emission line EL, and the first supply voltage line VDDL for convenience of illustration. It is, however, to be understood that embodiments according to the present disclosure are not limited thereto. For example, each of the sub-pixels PX may be connected to three scan lines SL rather than two scan lines SL.

Each of the sub-pixels PX may include a driving transistor, at least one switching transistor, a light-emitting element, and a capacitor. When the data voltage is applied to the gate electrode, the driving transistor DT may supply a driving current to the light-emitting element, so that light can be emitted. The driving transistor DT and the at least one transistor T may be thin-film transistors. The light-emitting element may emit light according to the driving current from the driving transistor DT. The light-emitting element may be an organic light-emitting diode including a first electrode, an organic emissive layer, and a second electrode. The capacitor can keep the data voltage applied to the gate electrode of the driving transistor DT constant.

The non-display area NDA may be defined as the area from the outer side of the display area DA to the edge of the display panel 100. In the non-display area NDA, a scan driver 410 for applying scan signals to scan lines SL, and pads DP connected to the data lines DL may be arranged. Because the circuit board 300 is attached to the pads DP, the pads DP may be arranged on one edge of the display panel 100, for example, the lower edge of the display panel 100.

The scan driver 410 may be connected to the display driver 200 through a plurality of first scan control lines SCL1. The scan driver 410 may receive scan control signals from the pads DP through the plurality of first scan control lines SCL1. The scan driver 410 may generate scan signals according to the scan control signals and may sequentially output the scan signals to the scan lines SL. The sub-pixels PX to which the data voltages are supplied are selected by the scan signals of the scan driver 410 and the data voltages are supplied to the selected sub-pixels PX.

An emission control driver 420 may be connected to a display driving circuit 320 through a plurality of scan control lines SCL. The emission control driver 420 may receive scan control signals from the pads DP through the plurality of second scan control lines SCL2. The emission control driver 420 may generate emission control signals according to the emission control signals and may sequentially output the emission control signals to the emission lines EL.

Although the scan driver 410 is arranged at an outer side of the display area DA, and the emission control driver 420 is arranged at the opposite side of the display area DA in the example shown in FIG. 2, embodiments according to the present disclosure are not limited thereto. Both the scan driver 410 and the emission control driver 420 may be arranged on an outer side of the display area DA or may be arranged on each of the outer sides of the display area DA.

The display driver 200 receives digital video data and timing signals from external devices. The display driver 200 converts the digital video data into analog positive/negative data voltages and supplies them to the data lines DL. The display driver 200 generates and supplies scan control signals for controlling the operation timing of the scan driver 410 through the first scan control lines SCL1. The display driver 200 generates and supplies emission signals for controlling the operation timing of the emission control driver 420 through the second scan control lines SCL2. The display driver 200 may supply a first supply voltage to the first supply voltage lines VDDL.

The display driver 200 may be implemented as an integrated circuit (IC) and attached to the circuit board 300 by the chip-on-film (COF) technique. Alternatively, the display driver 200 may be attached to the display panel 100 by any suitable mounting technique, such as a chip-on-glass (COG) technique, a chip-on-plastic (COP) technique, or ultrasonic bonding.

The circuit board 300 may be attached to the pads DP using an anisotropic conductive film. In this manner, the lead lines of the circuit board 300 may be electrically connected to the pads DP. The circuit board 300 may be a flexible printed circuit board, a printed circuit board, or a flexible film such as a chip-on-film.

Figure 3:
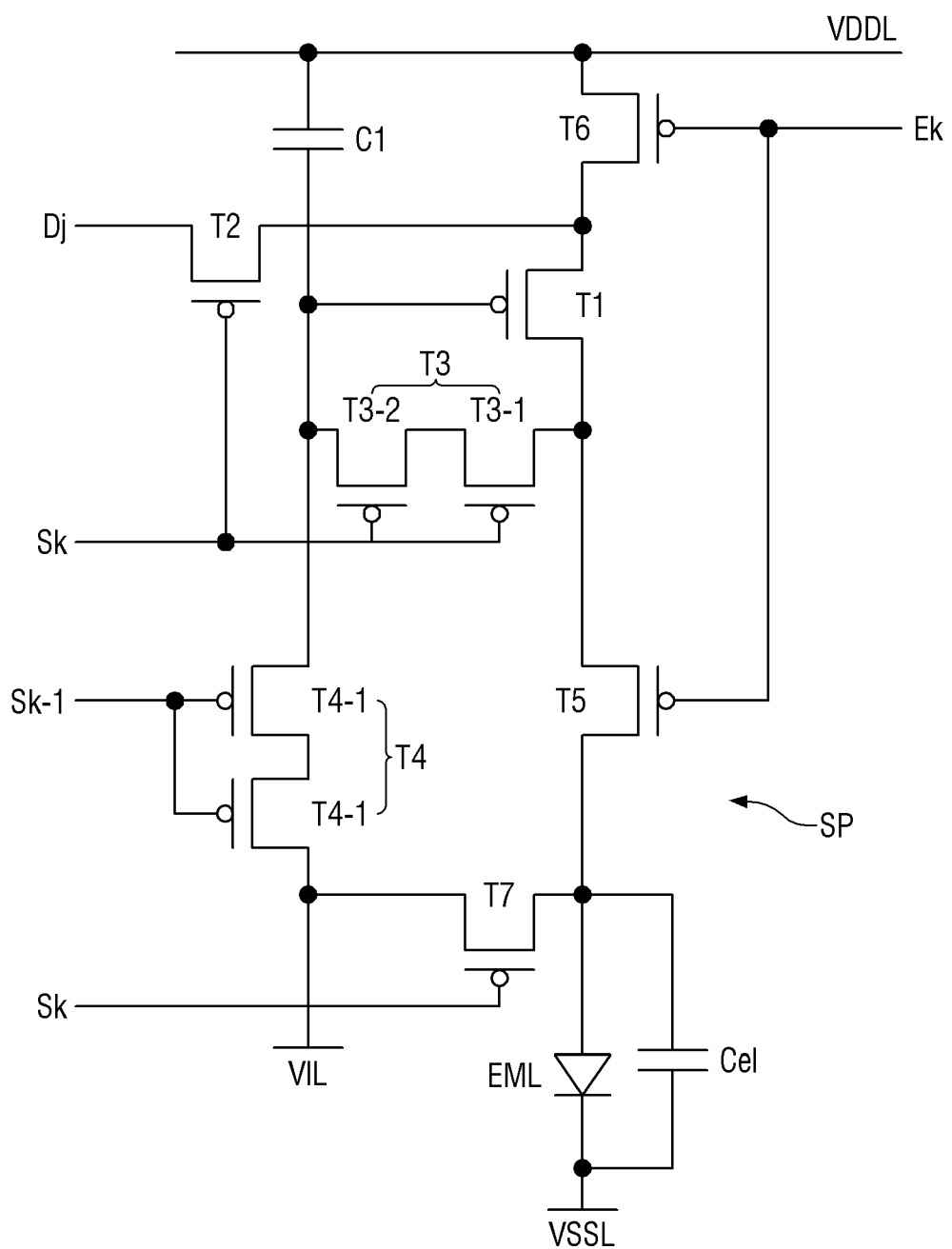
FIG. 3 is a circuit diagram showing an example of one of the sub-pixels of FIG. 2.

FIG. 3 is a circuit diagram showing an example of one of the sub-pixels of FIG. 2.

In the example shown in FIG. 3, the sub-pixel PX is connected to the $(k-1)^{th}$ scan line Sk−1, the $k^{th}$ scan line Sk, and the $j^{th}$ data line Dj.

In the example shown in FIG. 3, the sub-pixel PX may overlap the $(k-1)^{th}$ scan line S(k−1), the $k^{th}$ scan line Sk, and the $j^{th}$ data line Dj. In addition, the sub-pixel PX may be connected to a first supply voltage line VDDL to which the first supply voltage is applied, an initialization voltage line VIL to which an initialization voltage is applied, and a second supply voltage line VSSL to which a second supply voltage lower than the first supply voltage is applied.

The sub-pixel PX includes a driving transistor, a light-emitting element LE, switch elements and a first capacitor C1. The sub-pixel PX may include a first transistor T1 as the driving transistor DT, and second to seventh transistors T2, T3, T4, T5, T6 and T7 as the switch elements. However, the sub-pixel PX of embodiments according to the present disclosure is not limited by one shown in FIG. 3.

The first transistor T1 may include a first gate electrode, a first source electrode, and a first drain electrode. The drain-source current Ids (hereinafter referred to as "driving current") of the first transistor T1 is controlled according to the data voltage applied to the first gate electrode. The driving current Ids flowing through the channel of the first transistor T1 is proportional to the square of the difference between the gate-source voltage Vgs (the voltage between the gate electrode and the first source electrode of the first transistor T1) and the threshold voltage of the first transistor T1, as shown in Equation 1 below:

$$Ids = k' \times (Vgs - Vth)^2 \quad \text{[Equation 1]}$$

where k' denotes a proportional coefficient determined by the structure and physical properties of the first transistor T1, Vgs denotes the gate-source voltage of the first transistor T1, and Vth denotes the threshold voltage of the first transistor T1.

An emission material layer EML emits light as the driving current Ids flows therein. The amount of the light emitted from the emission material layer EML may be proportional to the driving current Ids. The emission material layer EML may be an organic light-emitting diode including a first electrode, a second electrode, and an organic emissive layer located between the first electrode and the second electrode.

Alternatively, the emission material layer EML may be an inorganic light-emitting element including a first electrode, a second electrode, and an inorganic semiconductor located between the first electrode and the second electrode. Alternatively, the emission material layer EML may be an inorganic light-emitting element including a first electrode, a second electrode, and an inorganic semiconductor located between the first electrode and the second electrode. Alternatively, the emission material layer EML may be a quantum-dot light-emitting element including a first electrode, a second electrode, and a quantum-dot emissive layer located between the first electrode and the second electrode. Alternatively, the emission material layer EML may be a micro light-emitting diode.

The first electrode of the emission material layer EML may be connected to the second electrode of the fifth transistor T5, and the second electrode thereof may be connected to the second supply voltage line VSSL. A parasitic capacitance Cel may be formed between the anode electrode and the cathode electrode of the emission material layer EML.

The second transistor T2 is turned on by the scan signal of the $k^{th}$ scan line Sk to connect the first source electrode of the first transistor T1 with the $j^{th}$ data line Dj. The second transistor T2 may include a second gate electrode, a second source electrode, and a second drain electrode. The second gate electrode may be connected to the $k^{th}$ scan line Sk, the second source electrode may be connected to the first source electrode of the first transistor T1, and the second drain electrode may be connected to the data line Dj.

The third transistor T3 may be implemented as a dual transistor including a (3-1) transistor T3-1 and a (3-2) transistor T3-2 connected in series between the gate electrode of the first transistor T1 and a node between the first transistor T1 and the fifth transistor T5. The (3-1) transistor T3-1 and the (3-2) transistor T3-2 are turned on by the scan signal from the $k^{th}$ scan line Sk to connect the first gate electrode with the first drain electrode of the first transistor T1. That is to say, when the (3-1) transistor T3-1 and the (3-2) transistor T3-2 are turned on, the first gate electrode and the first drain electrode of the first transistor T1 are connected to each other, and thus the first transistor T1 operates as a diode (e.g., is diode-connected). The (3-1) transistor T3-1 may include a (3-1) gate electrode, a (3-1) source electrode, and a (3-1) drain electrode.

The (3-1) gate electrode may be connected to the $k^{th}$ scan line Sk, the (3-1) source electrode may be connected to the first drain electrode of the first transistor T1, and the (3-1) drain electrode may be connected to the (3-2) source electrode of the (3-2) transistor T3-2. The (3-2) transistor T3-2 may include a (3-2) gate electrode, a (3-2) source electrode, and a (3-2) drain electrode. The (3-2) gate electrode may be connected to the $k^{th}$ scan line Sk, the (3-2) source electrode may be connected to the (3-1) drain electrode of the (3-1) transistor T3-1, and the (3-2) drain electrode may be connected to the first gate electrode of the first transistor T1.

The fourth transistor T4 may be implemented as a dual transistor including a (4-1) transistor T4-1 and a (4-2) transistor T4-2 connected in series between the third transistor T3 and the initialization voltage line VIL. The (4-1) transistor T4-1 and the (4-2) transistor T4-2 are turned on by the scan signal from the $(k-1)^{th}$ scan line Sk−1 to connect the first gate electrode of the first transistor T1 with the initialization voltage line VIL.

Therefore, the first gate electrode of the first transistor T1 may be discharged to the initialization voltage of the initialization voltage line VIL. The (4-1) transistor T4-1 may include a (4-1) gate electrode, a (4-1) source electrode, and a (4-1) drain electrode. The (4-1) gate electrode may be connected to the $(k-1)^{th}$ scan line Sk−1, the (4-1) source electrode may be connected to the first gate electrode of the first transistor T1, and the (4-1) drain electrode may be connected to the (4-2) source electrode of the (4-2) transistor T4-2. The (4-2) transistor T4-2 may include a (4-2) gate electrode, a (4-2) source electrode, and a (4-2) drain electrode. The (4-2) gate electrode may be connected to the $(k-1)^{th}$ scan line S(k−1), the (4-2) source electrode may be connected to the (4-1) drain electrode of the (4-1)transistor T4-1, and the (4-2) drain electrode may be connected to the initialization voltage line VIL.

The fifth transistor T5 is connected between the first drain electrode of the first transistor T1 and the anode electrode of the emission material layer EML. The fifth transistor T5 is turned on by the emission control signal of the $k^{th}$ emission line Ek to connect the first drain electrode of the first transistor T1 with the anode electrode of the emission material layer EML. The fifth transistor T5 may include a fifth gate electrode, a fifth source electrode, and a fifth drain electrode. The fifth gate electrode is connected to the $k^{th}$ emission line Ek, the fifth source electrode is connected to the first drain electrode of the first transistor T1, and the fifth drain electrode is connected to the anode electrode of the emission material layer EML.

The sixth transistor T6 is turned on by the emission control signal of the $k^{th}$ emission line Ek to connect the first source electrode of the first transistor T1 with the first supply voltage line VDDL. The sixth transistor T6 may include a sixth gate electrode, a sixth source electrode, and a sixth drain electrode. The sixth gate electrode is connected to the $k^{th}$ emission line Ek, the sixth source electrode is connected to the first supply voltage line VDDL, and the sixth drain electrode is connected to the first source electrode of the first transistor T1. When the fifth transistor T5 and the sixth transistor T6 both are turned on, the driving current Ids may be supplied to the emission material layer EML.

The seventh transistor T7 is turned on by the scan signal of the $k^{th}$ scan line Sk to connect the anode electrode of the emission material layer EML with the initialization voltage line VIL. The anode electrode of the emission material layer EML may be discharged to the initialization voltage. The seventh transistor T7 may include a seventh gate electrode, a seventh source electrode, and a seventh drain electrode. The seventh gate electrode is connected to the $k^{th}$ scan line Sk, the seventh source electrode is connected to the anode electrode of the emission material layer EML, and the seventh drain electrode is connected to the initialization voltage line Vini.

The first capacitor C1 is formed between the first drain electrode of the first transistor T1 and the first supply voltage line VDDL. One electrode of the first capacitor C1 may be connected to the first drain electrode of the first transistor T1 while the other electrode thereof may be connected to the first supply voltage line VDDL.

An active layer of each of the first to seventh transistors T1, T2, T3, T4, T5, T6, and T7 may be made of an oxide semiconductor including indium (In), gallium (Ga) and oxygen (O).

Although the first to seventh transistors T1, T2, T3, T4, T5, T6, and T7 are of p-type metal oxide semiconductor field effect transistors (MOSFETs), this is merely illustrative. They may be of n-type MOSFETs.

Figure 4:
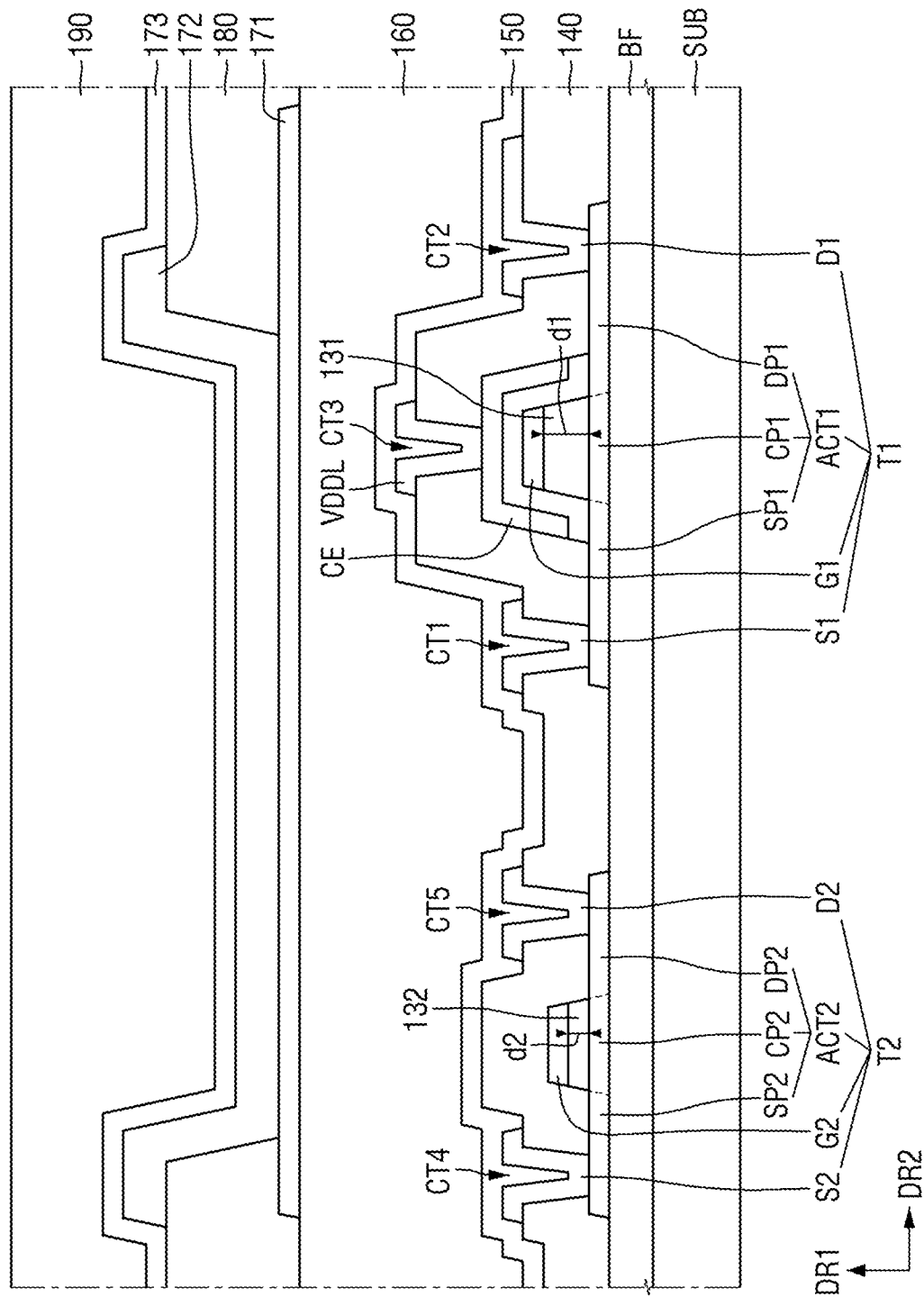
FIG. 4 is a cross-sectional view showing an example of the first transistor and the second transistor of FIG. 3.

FIG. 4 is a cross-sectional view showing an example of the first transistor and the second transistor of FIG. 3.

Referring to FIG. 4, a substrate SUB may be a rigid substrate or a flexible substrate that can be bent, folded, rolled, and so on. The substrate SUB may be made of an insulating material such as glass, quartz and a polymer resin.

A buffer layer BF may be formed on the substrate SUB. The buffer layer BF may be formed on the substrate SUB to protect the thin-film transistors and an emissive layer 172 from moisture permeating through the substrate SUB that is susceptible to moisture permeation. The buffer layer BF may be made up of multiple layers in which one or more inorganic layers of a silicon oxide layer, a silicon nitride layer, a silicon oxynitride layer, a titanium oxide layer and an aluminum oxide layer are alternately stacked on one another. For example, the buffer layer BF may be made up of multiple layers of a silicon nitride layer and a silicon oxide layer. In such case, the silicon oxide layer may be thicker than the silicon nitride layer. The buffer layer BF may be eliminated.

The first transistor T1 and the second transistor T2 may be formed on the buffer layer BF. The first transistor T1 may include a first active electrode ACT1, a first gate electrode G1, a first source electrode S1, and a first drain electrode D1. The second transistor T2 may include a second active electrode ACT2, a second gate electrode G2, a second source electrode S2, and a second drain electrode D2.

The first active layer ACT1 and the second active layer ACT2 may be formed on the buffer layer BF. The first active layer ACT1 and the second active layer ACT2 may be made of an oxide semiconductor including indium (In), gallium (Ga), and oxygen (O). For example, each of the first active layer ACT1 and the second active layer ACT2 may be made of IGZO (indium (In), gallium (Ga), zinc (Zn) and oxygen (O)), IGZTO (indium (In), gallium (Ga), zinc (Zn), tin (Sn) and oxygen (O)), or IGTO (indium (In), gallium (Ga), tin (Sn), and oxygen (O)).

A first gate insulating layer 131 may be formed on the first active layer ACT1. The first gate insulating layer 131 may be located on a portion of the first active layer ACT1. The first gate insulating layer 131 may be made of an inorganic layer, e.g., a silicon oxide layer.

The first gate electrode G1 may be formed on the first gate insulating layer 131. A portion of the first active layer ACT1 overlapping the first gate electrode G1 in a first direction DR1 may be defined as the first channel region CP1. A first source region SP1 may be located on one side of the first channel region CH1 in a second direction DR2 intersecting the first direction DR1, and the first drain region DP1 may be located on the other side of the first channel region CH1. The first direction DR1 may be the thickness direction of the substrate SUB, while the second direction DR2 may be the direction perpendicular to the first direction DR1. The first gate electrode G1 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

A second gate insulating layer 132 may be formed on the second active layer ACT2 and the first gate electrode G1. The second gate insulating layer 132 may be located on a portion of the second active layer ACT2. The second gate insulating layer 132 may be located on the upper surface and side surfaces of the first gate electrode G1. The second gate insulating layer 132 may be located on the side surfaces of the first gate insulating layer 131. The second gate insulating layer 132 may be located on a portion of the first source region SP1 and a portion of the first drain region DP1. The portion of the first source region SP1 and the portion of the first drain region DP1 may be adjacent to the first channel region CP1. The second gate insulating layer 132 may be made of an inorganic layer, for example, a silicon oxide layer.

The second gate electrode G2 and a capacitor electrode CE may be formed on the second gate insulating layer 132. The second gate electrode G2 and the capacitor electrode CE may be made up of a single layer or multiple layers of one of molybdenum (Mo), aluminum (Al), chromium (Cr), gold (Au), titanium (Ti), nickel (Ni), neodymium (Nd), and copper (Cu) or an alloy thereof.

A portion of the second active layer ACT2 overlapping the second gate electrode G2 in the first direction DR1 may be defined as the second channel region CP2. The second source region SP2 may be located on one side of the second channel region CP2, and the second drain region DP2 may be located on the other side of the second channel region CP2.

The capacitor electrode CE may overlap with the first gate electrode G1 in the first direction DR1. The capacitor electrode CE may be one electrode of the first capacitor C1 connected to the first supply voltage line VDDL. The capacitor electrode CE may be located on the upper surface of the second gate insulating layer 132 located on the upper surface of the first gate electrode G1. The capacitor electrode CE may be located on the side surfaces of the second gate insulating layer 132 located on the side surfaces of the first gate electrode G1. The capacitor electrode CE may overlap with the upper surface of the first gate electrode G1 in the first direction DR1. The capacitor electrode CE may overlap with the side surfaces of the first gate electrode G1 in the second direction DR2.

Incidentally, the first transistor T1 is a driving transistor, it is desired that the driving voltage range of the first transistor T1 is wide. The driving voltage range of the first transistor T1 ranges from a first voltage that allows a first driving current (e.g., a set or predetermined driving current) to flow to a second voltage that allows a second driving current (e.g., a set or predetermined driving current) to flow. The first driving current may be 1 nA, and the second driving current may be 500 nA.

Oxygen interstitial of the first gate insulating layer 131 can serve as a trap for electrons in the first channel region CP1. Because hydrogen in the first gate insulating layer 131 is combined with the oxygen interstitial, the lower the hydrogen concentration of the first gate insulating layer 131 is, the more electron traps caused by the oxygen interstitial may be in the first channel region CP1. In addition, the higher the hydrogen concentration of the first gate insulating layer 131 is, the less electron traps caused by oxygen interstitial may be in the first channel region CP1.

When the hydrogen concentration of the first gate insulating layer 131 is a first hydrogen concentration, electron traps due to oxygen interstitial increase, so that the slope of the driving current curve of the first transistor T1 may be gentle as indicated by (a) in FIG. 5A. Therefore, the driving voltage range of the first transistor T1 can be widened.

Figures 5, 6:
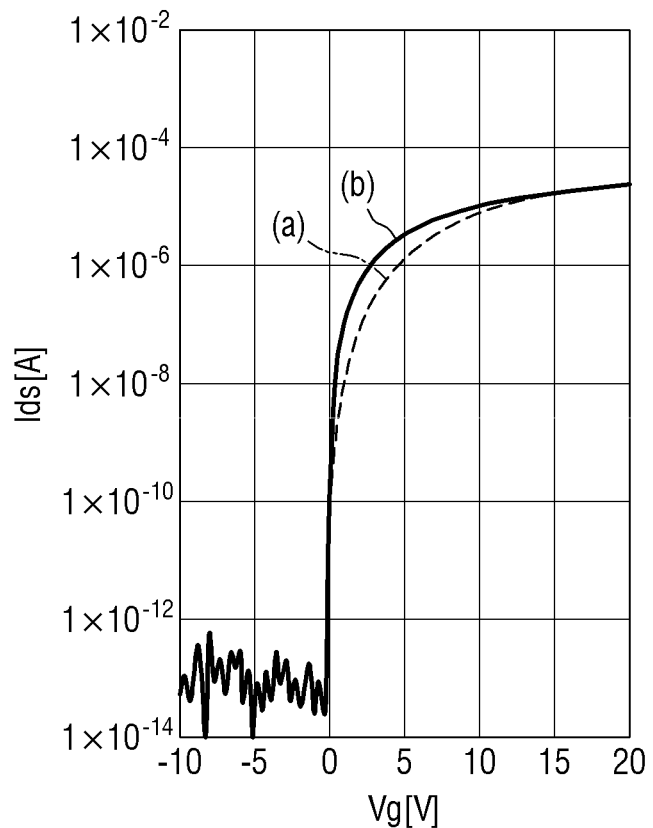
FIG. 5 is a graph showing driving current curves of first transistors having different the hydrogen concentrations of the first gate insulating layers.
FIG. 6 is a table showing the driving current flowing at the turn-on voltage, the driving current flowing at the turn-off voltage, the electron mobility and the driving voltage range of each of the first transistor and the second transistor.

In contrast, when the hydrogen concentration of the first gate insulating layer 131 is a second hydrogen concentration which is higher than the first hydrogen concentration, electron traps due to oxygen interstitial decrease, so that the slope of the driving current curve of the first transistor T1 may be steep as indicated by (b) in FIG. 5. Therefore, the driving voltage range of the first transistor T1 can be narrowed.

Because the first transistor T1 is a driving transistor, it is desired that the driving voltage range of the first transistor T1 is wide. For this reason, the hydrogen concentration of the first gate insulating layer 131 may be less than $5 \times 1,020$ atom/cm$^3$.

In contrast, the second transistor T2 is a switching transistor, and accordingly the driving voltage range of the second transistor T2 does not need to be wide. Therefore, the hydrogen concentration of the second gate insulating layer 132 may be 5×1,020 atom/cm$^3$ or more. That is to say, the hydrogen concentration of the first gate insulating layer 131 may be lower than the hydrogen concentration of the second gate insulating layer 132.

In addition, as the distance between the first gate electrode G1 and the first active layer ACT1 increases, the driving voltage range of the first transistor T1 may be widened. In contrast, the second transistor T2 is a switching transistor, and accordingly the driving voltage range of the second transistor T2 does not need to be wide. In addition, the minimum thickness d1 of the first gate insulating layer 131 may be larger than the minimum thickness d2 of the second gate insulating layer 132.

An interlayer dielectric layer 140 may be formed on the second gate electrode G2 and the capacitor electrode CE. The interlayer dielectric layer 132 may be arranged on a portion of the first source region SP1 other than the portion and on a portion of the first drain region DP1 other than the portion. The interlayer dielectric layer 140 may be arranged on the second source region SP2 and the second drain region DP2 of the second active layer ACT2. The interlayer dielectric layer 140 may be arranged on the buffer layer BF not covered by the first active layer ACT1 and the second active layer ACT2. The interlayer dielectric layer 140 may be made of an inorganic layer, for example, a silicon oxide layer, a silicon nitride layer, a silicon oxynitride layer, a titanium oxide layer, or an aluminum oxide layer.

The first source electrode S1, the first drain electrode D1, the second source electrode S2, the second drain electrode D2 and the first supply voltage line VDDL may be formed on the interlayer dielectric layer 140. The first source electrode S1, the first drain electrode D1, the second source electrode S2 and the second drain electrode D2 and the capacitor electrode CE may be made up of a single layer of one of molybdenum (Mo), aluminum (Al), chromium (Cr), gold (Au), titanium (Ti), nickel (Ni) neodymium (Nd) and copper (Cu), and an alloy thereof, or multiple layers thereof.

The first contact hole CT1 may be a hole penetrating through the interlayer dielectric layer 140 to expose the first source region SP1 of the first active layer ACT1. The first source electrode S1 may be connected to the first source region SP1 through the first contact hole CT1.

The second contact hole CT2 may be a hole that penetrates through the interlayer dielectric layer 140 to expose the first drain region DP1 of the first active layer ACT1. The first drain electrode D1 may be connected to the first drain region DP1 through the second contact hole CT2.

The third contact hole CT3 may be a hole that penetrates through the interlayer dielectric layer 140 to expose the capacitor electrode CE. The first supply voltage line VDDL may be connected to the capacitor electrode CE through the third contact hole CT3.

The fourth contact hole CT4 may be a hole that penetrates through the interlayer dielectric layer 140 to expose the second source region SP2 of the second active layer ACT2. The second source electrode S2 may be connected to the second source region SP2 through the fourth contact hole CT4.

The fifth contact hole CT5 may be a hole that penetrates through the interlayer dielectric layer 140 to expose the second drain region DP2 of the second active layer ACT2. The second drain electrode D2 may be connected to the second drain region DP2 through the fifth contact hole CT5.

A passivation layer 150 may be formed on the first source electrode S1, the first drain electrode D1, the second source electrode S2, the second drain electrode D2 and the first supply voltage line VDDL. The passivation layer 150 may be made of an inorganic layer, for example, a silicon oxide layer, a silicon nitride layer, a silicon oxynitride layer, a titanium oxide layer, or an aluminum oxide layer.

A planarization layer 160 may be formed on the passivation layer 150 to provide a flat surface over the first transistor T1 and the second transistor T2. The planarization layer 160 may be formed of an organic layer such as an acryl resin, an epoxy resin, a phenolic resin, a polyamide resin and a polyimide resin.

Although the first transistor T1 and the second transistor T2 are implemented as top-gate transistors in the example shown in FIG. 4, it is to be understood that the present disclosure is not limited thereto. That is to say, the first transistor T1 and the second transistor T2 may be implemented as bottom-gate transistors in which the gate electrode is located below the active layer, or as double-gate transistors in which the gate electrodes are arranged above and below the active layer.

A first electrode 171 and a bank layer 180 of the emission material layer EML are formed on the planarization layer 160.

A sixth contact hole may be formed through the planarization layer 160 to expose the fifth drain electrode of the fifth transistor T5. The first electrode 171 may be connected to the fifth drain electrode of the fifth transistor T5 through the sixth contact hole. The first electrode 171 may be made of a metal material having a high reflectance in a top-emission structure in which light exits toward the second electrode 173 from the emissive layer 172. For example, the first electrode 171 may be formed as a stack structure of aluminum and titanium (Ti/Al/Ti), a stack structure of aluminum and ITO (ITO/Al/ITO), an APC alloy and a stack structure of an APC alloy and ITO (ITO/APC/ITO). The APC alloy is an alloy of silver (Ag), palladium (Pd) and copper (Cu). Alternatively, the first electrode 171 may be made up of a single layer of molybdenum (Mo), titanium (Ti), copper (Cu), or aluminum (Al).

The bank layer 180 may be formed on the planarization layer 160 to partition the first electrode 171 in order to define an emission area of each of the sub-pixels PX. To this end, the bank layer 180 may be formed to cover the edge of the first electrode 171. In the emission area EA of each of the sub-pixels, the first electrode 171, the emissive layer 172 and the second electrode 173 are stacked on one another in this order, so that holes from the first electrode 171 and electrons from the second electrode 173 are combined with each other in the emissive layer 172 to emit light. The bank layer 180 may be formed of an organic layer such as an acryl resin, an epoxy resin, a phenolic resin, a polyamide resin, and a polyimide resin.

The emissive layer 172 is formed on the first electrode 171 and the bank layer 180. The emissive layer 172 may include an organic material and emit light of a certain color. For example, the emissive layer 172 may include a hole transporting layer, an organic material layer, and an electron transporting layer.

The second electrode 173 is formed on the emissive layer 172. The second electrode 173 may be formed to cover the emissive layer 172. The second electrode 173 may be a common layer formed across the sub-pixels PX. A capping layer may be formed on the second electrode 173.

In the top-emission organic light-emitting diode, the second electrode 173 may be formed of a transparent conductive material (TCP) such as ITO and IZO that can transmit light, or a semi-transmissive conductive material such as magnesium (Mg), silver (Ag) and an alloy of magnesium (Mg) and silver (Ag). When the second electrode 173 is formed of a semi-transmissive conductive material, the light extraction efficiency can be increased by using microcavities.

An encapsulation layer 190 may be formed on the second electrode 173. The encapsulation layer 190 may include at least one inorganic layer to prevent or reduce oxygen, moisture, or other contaminants from permeating into the emissive layer 172 and the second electrode 173. In addition, the encapsulation layer 190 may include at least one organic layer to protect the emissive layer 172 from foreign substances such as dust.

Alternatively, a substrate may be arranged on the second electrode 173 instead of the encapsulation layer 190, such that the space between the second electrode and the substrate may be empty in a vacuum state or a filler film may be located therein. The filler film may be an epoxy filler film or a silicon filler film.

According to the example embodiment shown in FIG. 4, the hydrogen concentration of the first gate insulating layer 131 between the first active layer ACT1 and the first gate electrode G1 of the first transistor T1 is lower than the hydrogen concentration of the second gate insulating layer 132 between the second active layer ACT2 and the second gate electrode G2 of the second transistor T2. As the hydrogen concentration of the first gate insulating layer is lower, the electron trap by oxygen interstitial of the first gate insulating layer can increase. Therefore, the driving voltage range of the first transistor T1 can be widened.

In addition, according to the example embodiment shown in FIG. 4, the minimum thickness d1 of the first gate insulating layer 131 may be larger than the minimum thickness d2 of the second gate insulating layer 132. As a result, the distance between the first gate electrode G1 and the first active layer ACT1 increases, are accordingly the driving voltage range of the first transistor T1 can be widened.

The (3-1) transistor T3-1, the (3-2) transistor T-2, the (4-1) transistor T4-1, and the (4-2) transistor T4-2, the fifth transistor T5, the sixth transistor T6 and the seventh transistor T7 shown in FIG. 3 may be substantially identical to the second transistor T2 described above with reference to FIG. 4; and, therefore, the redundant description will be omitted.

FIG. 6 is a table showing the driving current flowing at the turn-on voltage, the driving current flowing at the turn-off voltage, the electron mobility and the driving voltage range of each of the first transistor and the second transistor.

In FIG. 6, the turn-on voltage applied to the gate electrodes of the first transistor T1 and the second transistor T2 may be 15 V, and the turn-off voltage applied thereto may be 0 V. In FIG. 6, DR may refer to the driving voltage range of each of the first transistor T1 and the second transistor T2. In FIG. 6, the threshold voltage may refer to the gate voltage applied to the gate electrode of the first transistor T1 or the second transistor T2 when the driving current of 10 nA is flowing through the first transistor T1 or the second transistor T2. In FIG. 6, the channel length of the first channel region CP1 of the first transistor T1 and the channel length of the second channel region CP2 of the second transistor T2 may be 3.5 μm.

Referring to FIG. 6, when the turn-on voltage is applied to the first gate electrode G1 of the first transistor T1, the driving current is $7.58\times10^{-6}$ A. When the turn-off voltage is applied to the first gate electrode G1 of the first transistor T1, the driving current is $4.61\times10^{-11}$ A. In addition, the electron mobility of the first transistor T1 may be 4.04 cm$^2$/V×s, and the driving voltage range DR may be 3.12 V. The threshold voltage Vth of the first transistor T1 may be 0.54 V.

When the turn-on voltage is applied to the second gate electrode G2 of the second transistor T2, the driving current is $1.78\times10^{-5}$ A. When the turn-off voltage is applied to the second gate electrode G2 of the second transistor T2, the driving current is $5.75\times10^{-11}$ A. The electron mobility of the second transistor T2 may be 12.49 cm$^2$/V×s, and the driving voltage range DR may be 1.88V. The threshold voltage Vth of the second transistor T2 may be 0.30 V.

Because the hydrogen concentration of the first gate insulating layer 131 is lower than that of the second gate insulating layer 132, there may be more electron traps by oxygen interstitial in the first channel region CP1 of the first transistor T1 than in the second channel region CP2 of the transistor T2. Therefore, the electron mobility of the first transistor T1 may be lower than the electron mobility of the second transistor T2. In addition, the slope of the driving current curve of the first transistor T1 may be gentler than the slope of the driving current curve of the second transistor T2, and thus the driving voltage range DR of the first transistor T1 may be wider than the driving voltage range DR of the second transistors T2.

Figure 7:
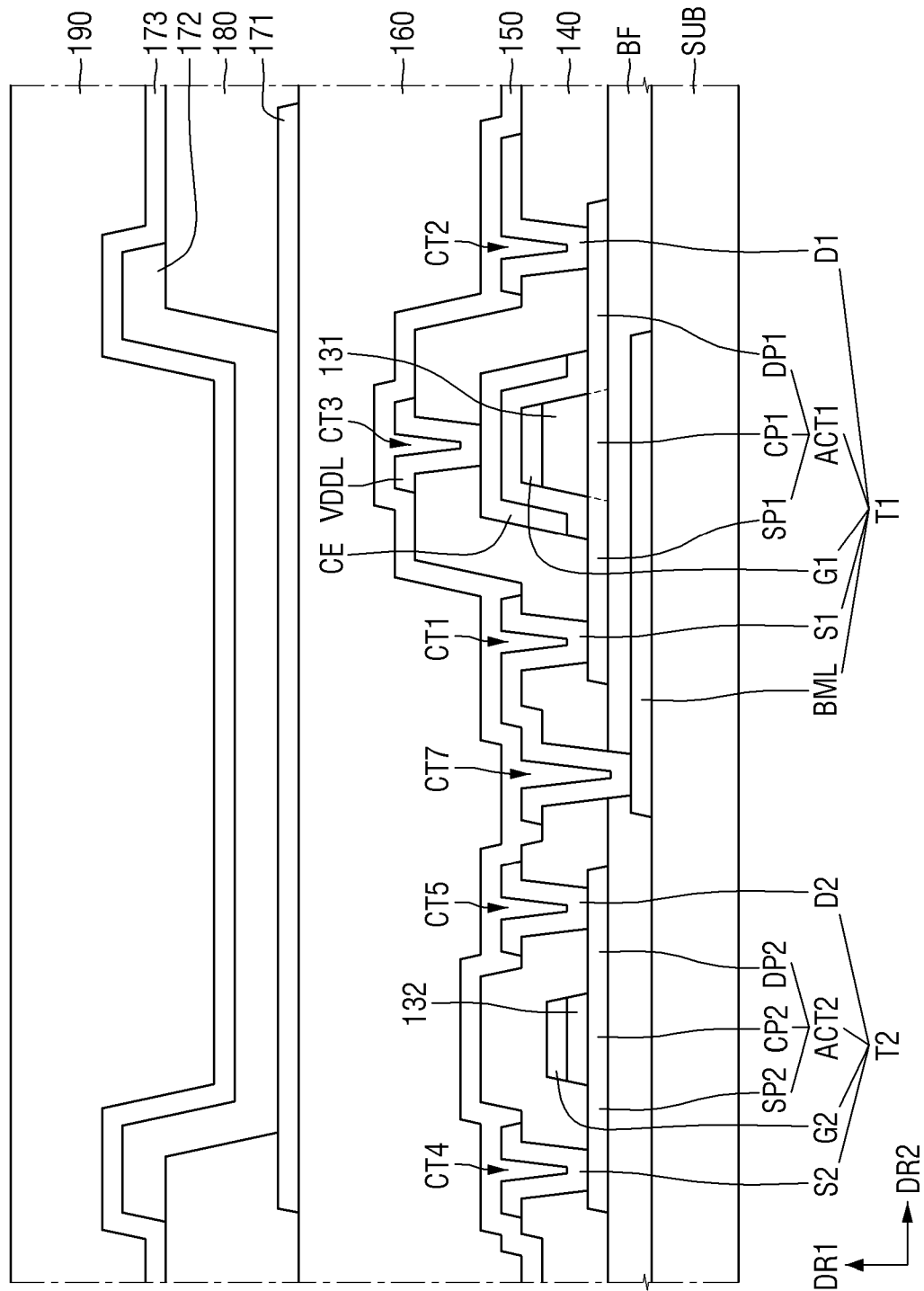
FIG. 7 is a cross-sectional view showing an example of the first transistor and the second transistor of FIG. 3.

FIG. 7 is a cross-sectional view showing an example of the first transistor and the second transistor of FIG. 3.

The example embodiment shown in FIG. 7 is different from the example embodiment of FIG. 4 in that a light shielding layer BML is formed on a substrate SUB, and that a source electrode S1 of a first transistor T1 is connected to the light shielding layer BML.

Referring to FIG. 7, a light shielding layer BML may be formed on the substrate SUB. The light shielding layer BML may overlap a first channel region CP1 of a first active layer ACT1 in the first direction DR1. By virtue of the light shielding layer BML, it may be possible to prevent or reduce light coming from the substrate SUB from being incident on the first channel region CP1 of the first active layer ACT1. In this manner, it may be possible to prevent or reduce leakage current which otherwise flows in the first channel region CP1 of the first active layer ACT1 due to the light. The light shielding layer BML may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. A buffer layer BF may be formed on the light shielding layer BML.

The seventh contact hole CT7 may be a hole that penetrates through the interlayer dielectric layer 140 and the buffer layer BF to expose the light shielding layer BML. The first source electrode S1 may be connected to the light shielding layer BML through the seventh contact hole CT7.

When the first source electrode S1 is connected to the light shielding layer BML through the seventh contact hole CT7, the light shielding layer BML and the first source electrode S1 have the same voltage. When the light shielding layer BML and the first source electrode S1 have the same potential, the first active layer ACT1 adjacent to the light shielding BML in the first direction DR1 may not be activated ACT1 as much as the first active layer ACT1 adjacent to the first gate electrode G1 is. That is to say, the electron mobility of the first channel region CH1 of the first active layer ACT1 may be reduced, and the slope of the driving current curve of the first transistor T1 may be decreased. Accordingly, when the first source electrode S1 is connected to the light shielding layer BML through the seventh contact hole CT7 as shown in FIG. 8, the driving voltage range DR of the first transistor T1 can be widened, compared with the driving voltage range DR of the first transistor T1 not including the light shielding BML as shown in FIG. 4.

FIG. 8 is a table showing the driving current flowing at the turn-on voltage, the driving current flowing at the turn-off voltage, the electron mobility and the driving voltage range of the first transistor.

In FIG. 8, the turn-on voltage applied to the gate electrode of the first transistor T1 may be 15 V, and the turn-off voltage applied thereto may be 0 V. In FIG. 8, DR may refer to the driving voltage range of the first transistor T1. In FIG. 8, the threshold voltage may refer to the gate voltage when the driving current of 10 nA is flowing. In FIG. 8, the channel length of the first channel region CP1 of the first transistor T1 and the channel length of the second channel region CP2 of the second transistor T2 may be 3.5 μm.

Referring to FIG. 8, when the turn-on voltage is applied to the first gate electrode G1 of the first transistor T1, the driving current is $6.33 \times 10^{-6}$ A. When the turn-off voltage is applied to the first gate electrode G1 of the first transistor T1, the driving current is $2.54 \times 10^{-13}$ A. In addition, the electron mobility of the first transistor T1 may be 3.20 cm$^2$/V×s, and the driving voltage range DR may be 3.54 V. The threshold voltage Vth of the first transistor T1 may be 1.07 V.

By connecting the light shielding layer BML located under the first channel region CP1 of the first active layer ACT1 with the first source electrode S1, the electron mobility of the first channel region CH1 of the first active layer ACT1 can be reduced, such that the slope of the driving current curve of the first transistor T1 can be decreased. Accordingly, when the first source electrode S1 is connected to the light shielding layer BML, the driving voltage range DR of the first transistor T1 can be widened, compared with the driving voltage range DR of the first transistor T1 not including the light shielding BML.

Figure 9:
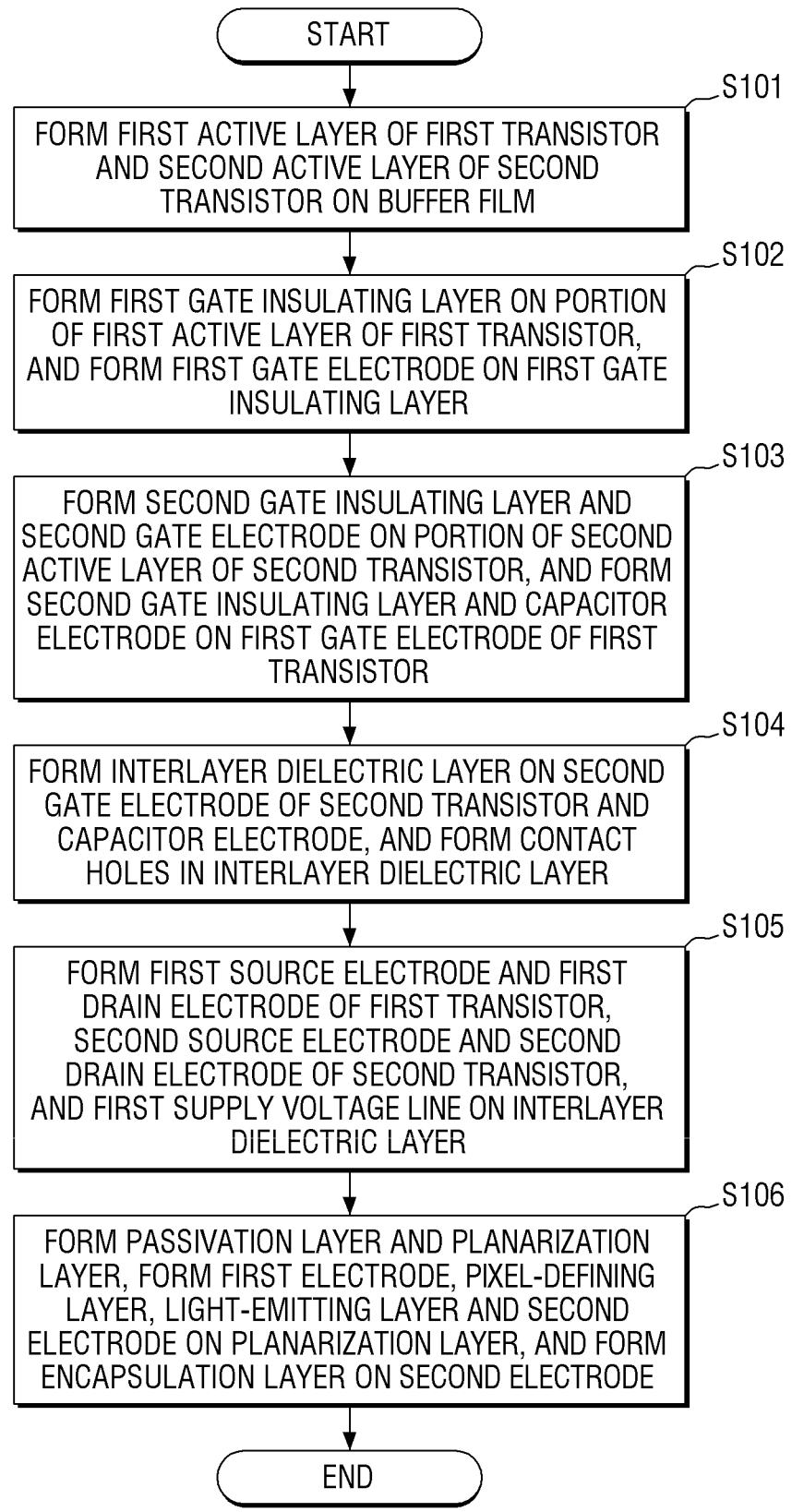
FIG. 9 is a flowchart for illustrating a method of fabricating a display device according to some example embodiments of the present disclosure.

FIG. 9 is a flowchart for illustrating a method of fabricating a display device according to some example embodiments of the present disclosure. FIGS. 10 to 19 are cross-sectional views of a first transistor and a second transistor for illustrating a method of fabricating a display device according to some example embodiments of the present disclosure.

Hereinafter, a method of fabricating a display device according to some example embodiments will be described in more detail with reference to FIGS. 9 to 19.

Figure 10:
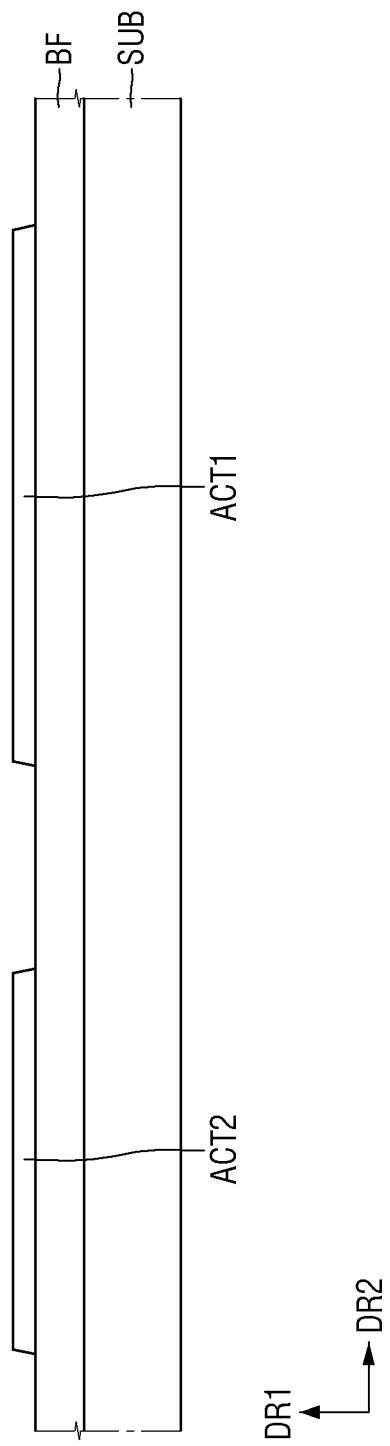
FIGS. 10 to 21 are cross-sectional views of a first transistor and a second transistor for illustrating a method of fabricating a display device according to some example embodiments of the present disclosure.

Firstly, as shown in FIG. 10, a buffer layer BF is formed on a substrate SUB, and a first active layer ACT1 of a first transistor T1 and a second active layer ACT2 of a second transistor T2 are formed on the buffer layer BF (step S101 in FIG. 9).

For example, the buffer layer BF may be formed by using plasma-enhanced chemical vapor deposition (PECVD) technique.

Subsequently, an active material layer may be formed on the buffer layer BF, and a photoresist pattern may be formed on the active material layer. The active material layer may be an oxide semiconductor including indium (In), gallium (Ga), and oxygen (O). For example, the active material layer may be made of IGZO (Indium (In), Gallium (Ga), Zinc (Zn) and Oxygen (O)), IGZTO (Indium (In), Gallium (Ga), Zinc (Zn), Tin (Sn) and Oxygen (O)) or IGTO (indium (In), gallium (Ga), tin (Sn) and oxygen (O)). The active material layer may be formed by using sputtering or metal-organic chemical vapor deposition (MOCVD) technique.

Subsequently, the active material layer not covered by the photoresist pattern is etched to form the first active layer ACT1 and the second active layer ACT2. Subsequently, the photoresist pattern may be removed via a stripping process.

Figure 11:
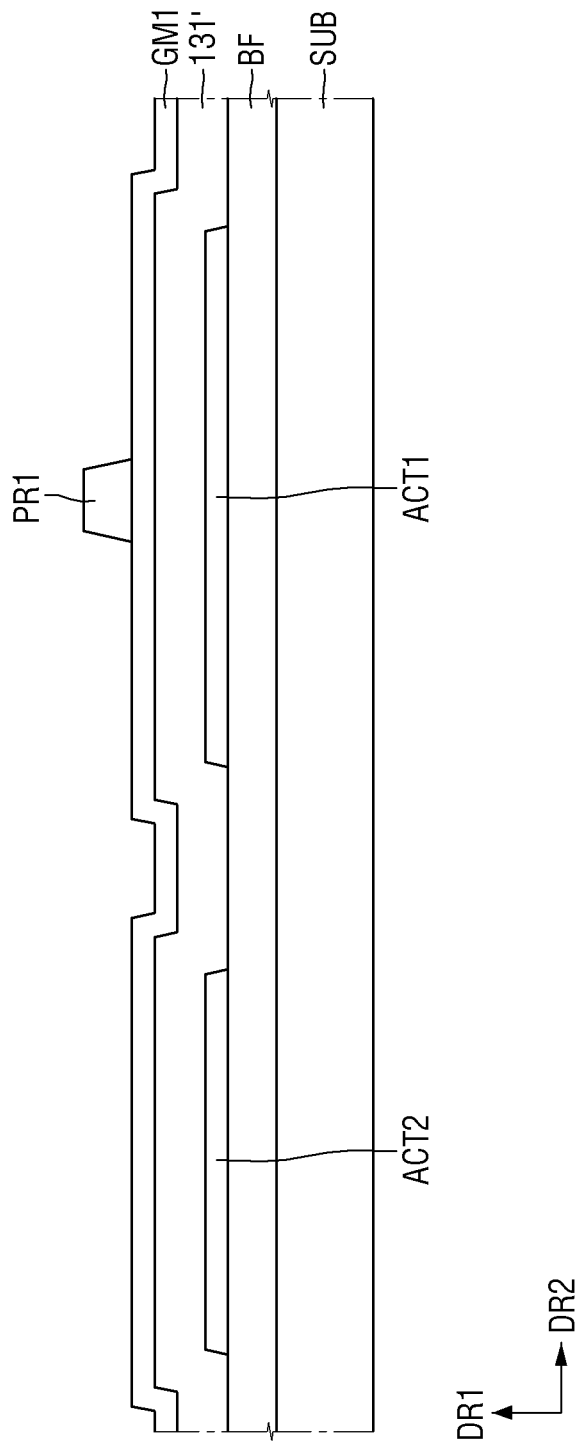
Figure 12:
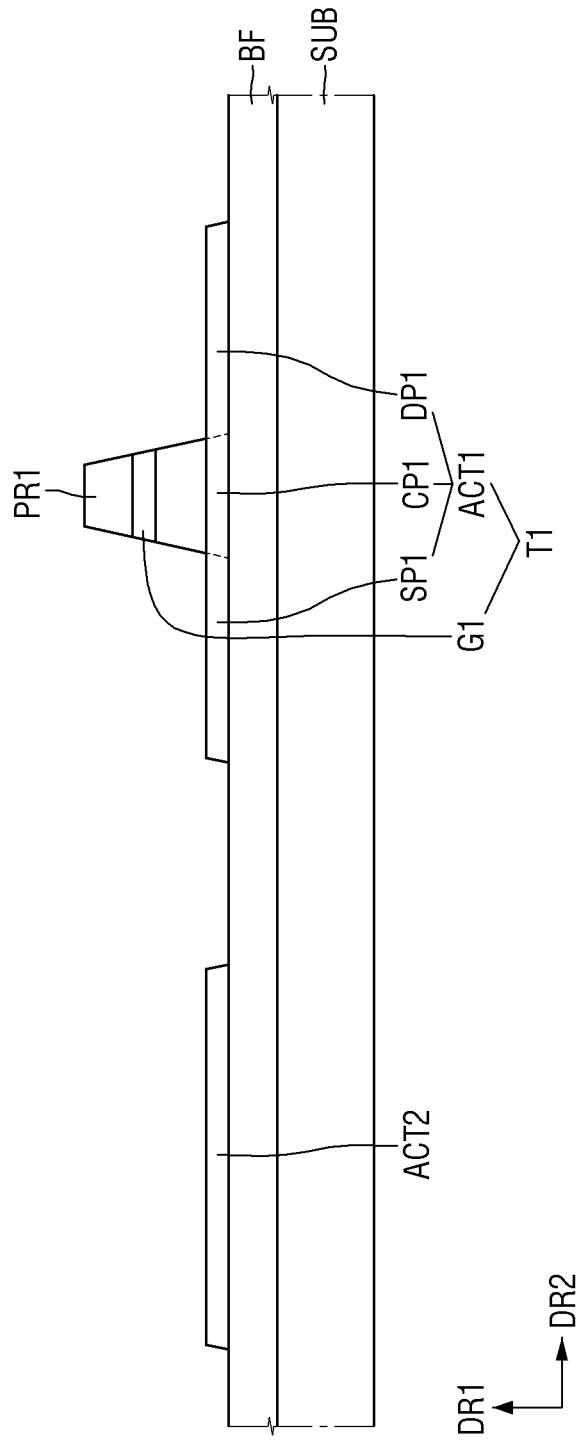
Figure 13:
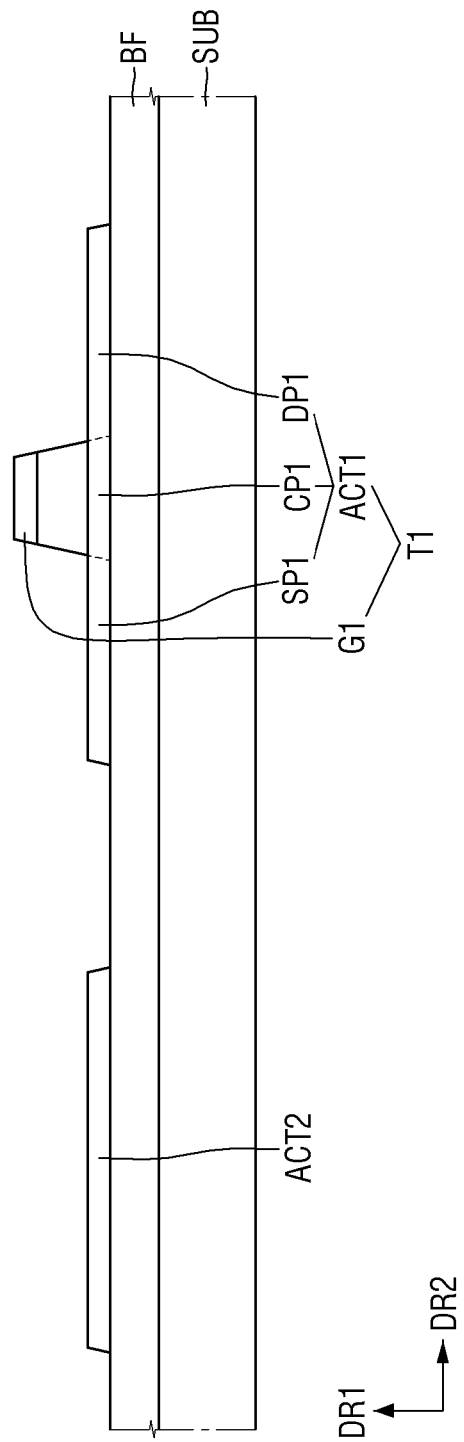

Secondly, as shown in FIGS. 11 to 13, a first gate insulating layer 131 is formed on a portion of the first active layer ACT1 of the first transistor T1, and a first gate electrode G1 is formed on the first gate insulating layer 131 (step S102 in FIG. 9).

For example, as shown in FIG. 11, a first gate insulating material layer 131' may be formed on the first active layer ACT1 and the second active layer ACT2. In addition, the first gate insulating material layer 131' may be formed on a part of the buffer layer BF that is not covered by the first active layer ACT1 and the second active layer ACT2. The first gate insulating material layer 131' may be formed as an inorganic layer, for example, a silicon oxide layer. The first gate insulating material layer 131' may be formed by using PECVD technique.

Subsequently, a first gate metal layer GM1 may be formed on the first gate insulating material layer 131'. The first gate metal layer GM1 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. The first gate metal layer GM1 may be formed by using sputtering or MOCVD technique.

Subsequently, a photoresist pattern PR1 may be formed on first gate metal layer GM1. The photoresist pattern PR1 may overlap with a portion of the first active layer ACT1 in the first direction DR1.

Subsequently, as shown in FIG. 12, the first gate electrode G1 may be formed by wet or dry etching the first gate metal layer GM1 using the photoresist pattern PR1 as a mask. Subsequently, the first gate insulating layer 131 may be formed by dry etching the first gate insulating material layer 131' by using the first gate electrode G1 as a mask. In doing so, a portion of the first active layer ACT1 that is not covered by the first gate insulating layer 131 may be exposed to a plasma during the dry etching process and may become the first source region SP1 having conductivity. In addition, another portion of the first active layer ACT1 that is not covered by the first gate insulating layer 131 may be exposed to a plasma during the dry etching process and may become the first drain region DP1 having conductivity.

Subsequently, as shown in FIG. 13, the photoresist pattern PR1 may be removed via a stripping process.

Thirdly, as shown in FIGS. 14 to 18, a second gate insulating layer 132 and a second gate electrode G2 are formed on a portion of the second active layer ACT2 of the second transistor T2, and the second gate insulating layer 132 and a capacitor electrode CE are formed on the first gate electrode G1 of the first transistor T1 (step S103 of FIG. 9).

Figure 14:
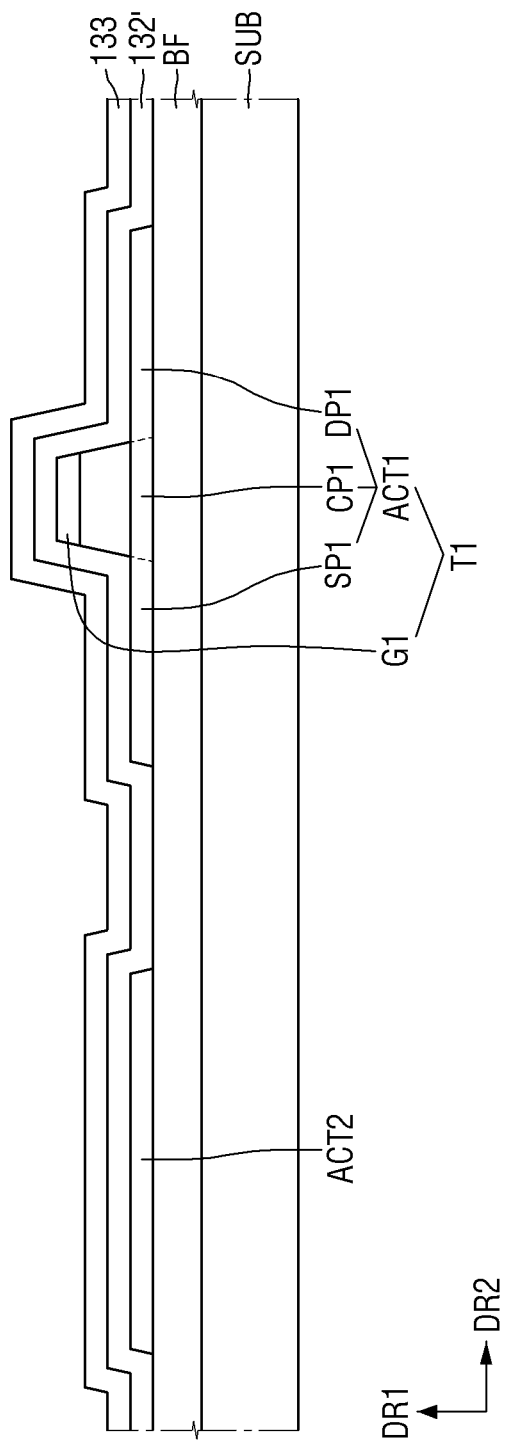

For example, as shown in FIG. 14, the second gate insulating material layer 132' may be formed on the first gate electrode G1. In addition, the second gate insulating material layer 132' may be formed on side surfaces of the first gate insulating layer 131. In addition, the second gate insulating material layer 132' may be formed on the first active layer ACT1 not covered by the first gate insulating layer 131. In addition, the second gate insulating material layer 132' may be formed on the second active layer ACT2. In addition, the second gate insulating material layer 132' may be formed on a part of the buffer layer BF that is not covered by the first active layer ACT1 and the second active layer ACT2. The second gate insulating material layer 132' may be formed as an inorganic layer, for example, a silicon oxide layer. The second gate insulating material layer 132' may be formed by using PECVD technique.

Subsequently, as shown in FIG. 14, an oxygen supply layer 133 may be formed on the second gate insulating material layer 132' as shown in FIG. 14. Oxygen is supplied to the second gate insulating material layer 132' by an oxygen plasma during a process of depositing the oxygen supply layer 133, and oxygen may be supplied to the second active layer ACT2 via a heat treatment process after deposition of the oxygen supply layer 133. By doing so, the second active layer ACT2, which has been exposed to the plasma during the dry etching process for forming the first gate insulating layer 131 to become a conductor, may become a semiconductor layer again.

The oxygen supply layer 133 may be made of the same material as the second active layer ACT2. The oxygen supply layer 133 may be an oxide semiconductor including indium (In), gallium (Ga), and oxygen (O). For example, the oxygen supply layer 133 may be made of IGZO (Indium (In), Gallium (Ga), Zinc (Zn) and Oxygen (O)), IGZTO (Indium (In), Gallium (Ga), Zinc (Zn), Tin (Sn) and Oxygen (O)) or IGTO (indium (In), gallium (Ga), tin (Sn) and oxygen (O)). The oxygen supply layer 133 may be formed by using sputtering or metal-organic chemical vapor deposition (MOCVD) technique.

Figure 15:
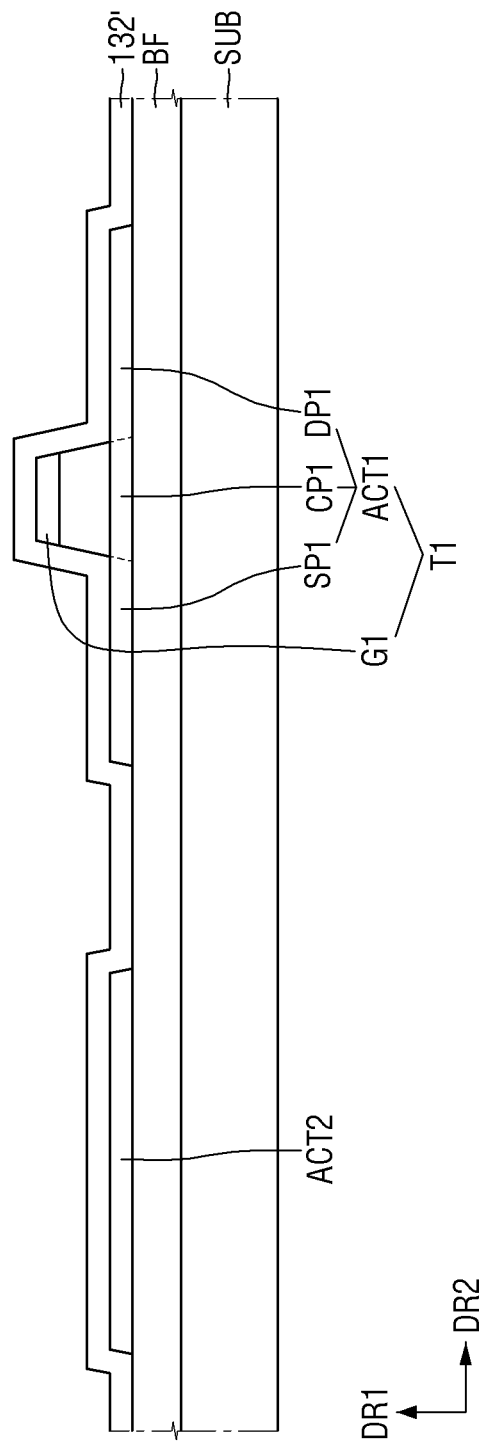

Subsequently, the oxygen supply layer 133 is wet etched and removed as shown in FIG. 15.

Figure 16:
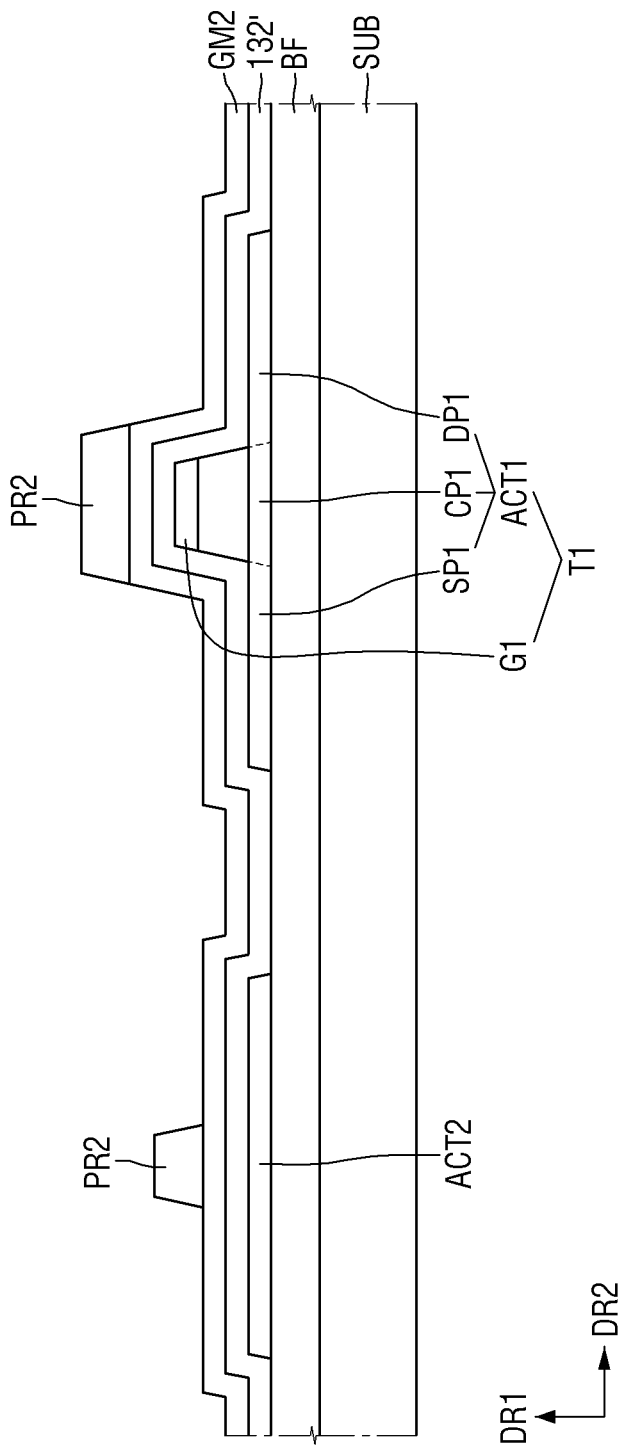

Subsequently, as shown in FIG. 16, the second gate metal layer GM2 may be formed on the second gate insulating material layer 132'. The second gate metal layer GM2 may be made up of a single layer or multiple layers of one of molybdenum (Mo), aluminum (Al), chromium (Cr), gold (Au), titanium (Ti), nickel (Ni), neodymium (Nd), and copper (Cu) or an alloy thereof. The second gate metal layer GM2 may be formed by using sputtering or MOCVD technique.

Subsequently, a photoresist pattern PR2 may be formed on second gate metal layer GM2. The photoresist pattern PR2 may overlap with a portion of the second active layer ACT2 in the first direction DR1. The photoresist pattern PR2 may overlap the first gate electrode G1 in the first direction DR1.

Figure 17:
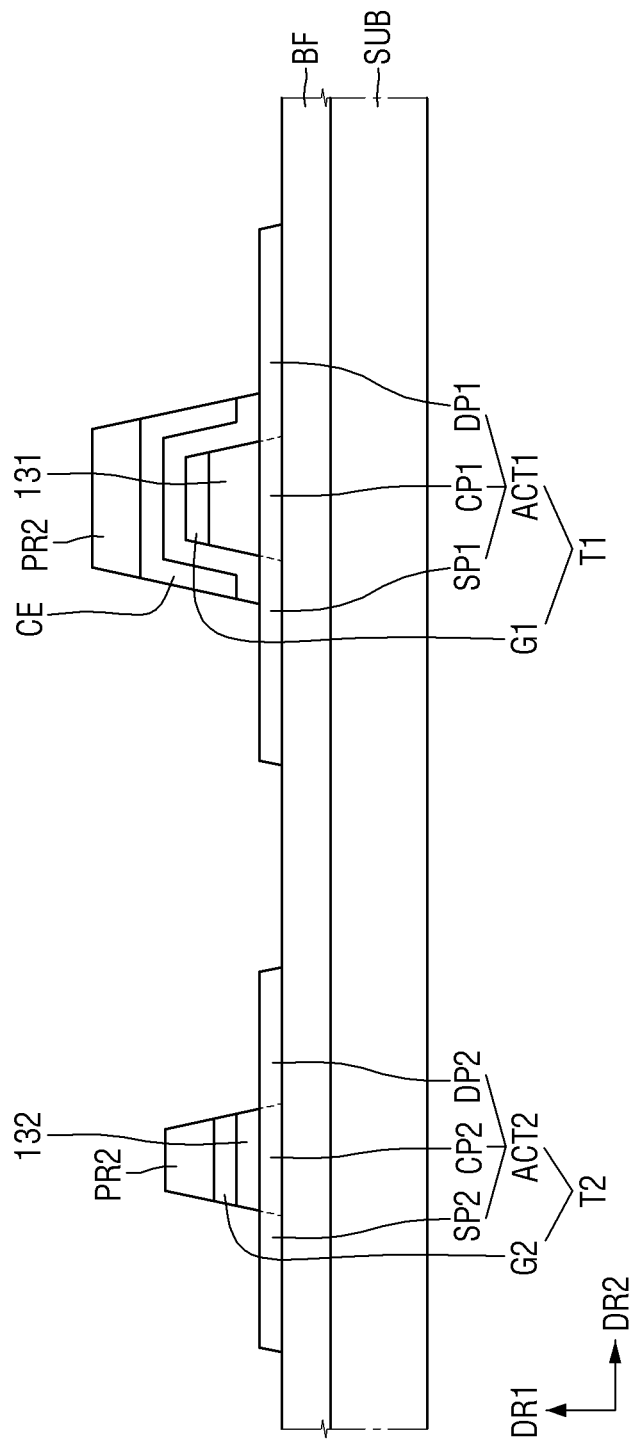

Subsequently, as shown in FIG. 17, the second gate metal layer GM2 not covered by the photoresist pattern PR2 may be wet or dry etched to form the second gate electrode G2 and the capacitor electrode CE. Subsequently, the second gate insulating layer 132 may be formed by dry etching the second gate insulating material layer 132' by using the second gate electrode G2 and the capacitor electrode CE as masks. In doing so, a portion of the second active layer ACT2 that is not covered by the second gate insulating layer 132 may be exposed to a plasma during the dry etching process and may become the second source region SP2 having conductivity. In addition, another portion of the second active layer ACT2 that is not covered by the second gate insulating layer 132 may be exposed to a plasma during the dry etching process and may become the second drain region DP2 having conductivity.

Figure 18:
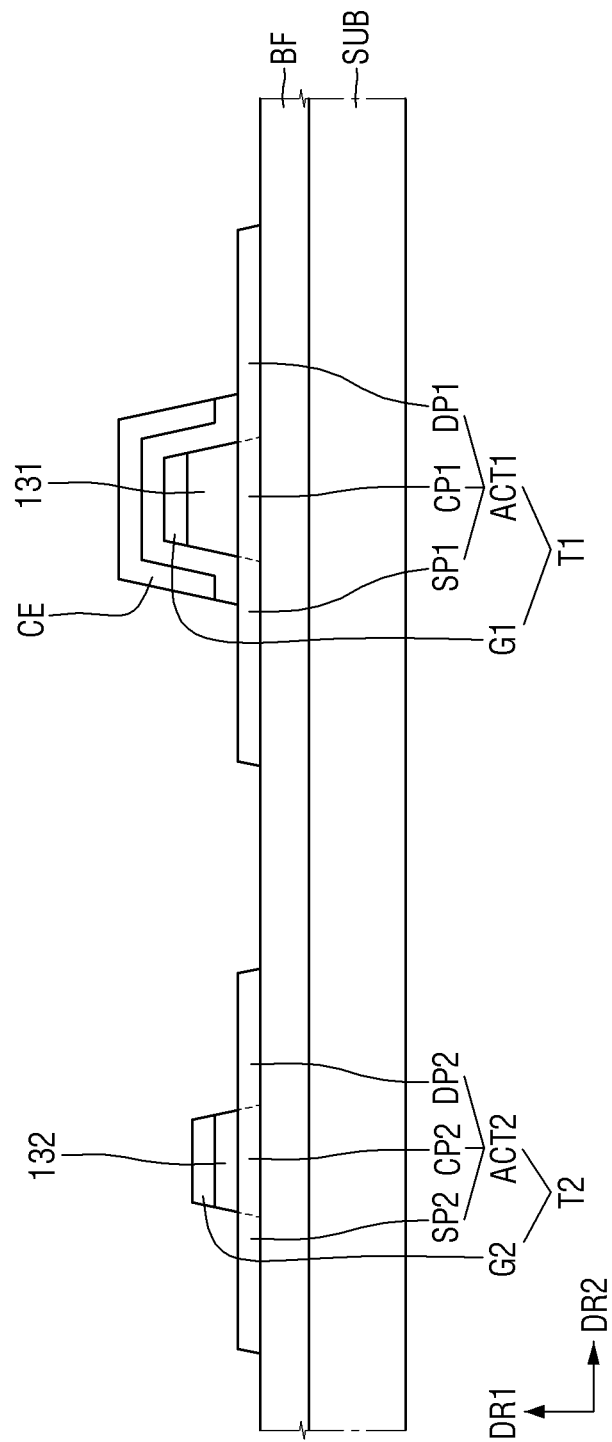

Subsequently, as shown in FIG. 18, the photoresist pattern PR2 may be removed (e.g., by way of any suitable stripping process).

Figure 19:
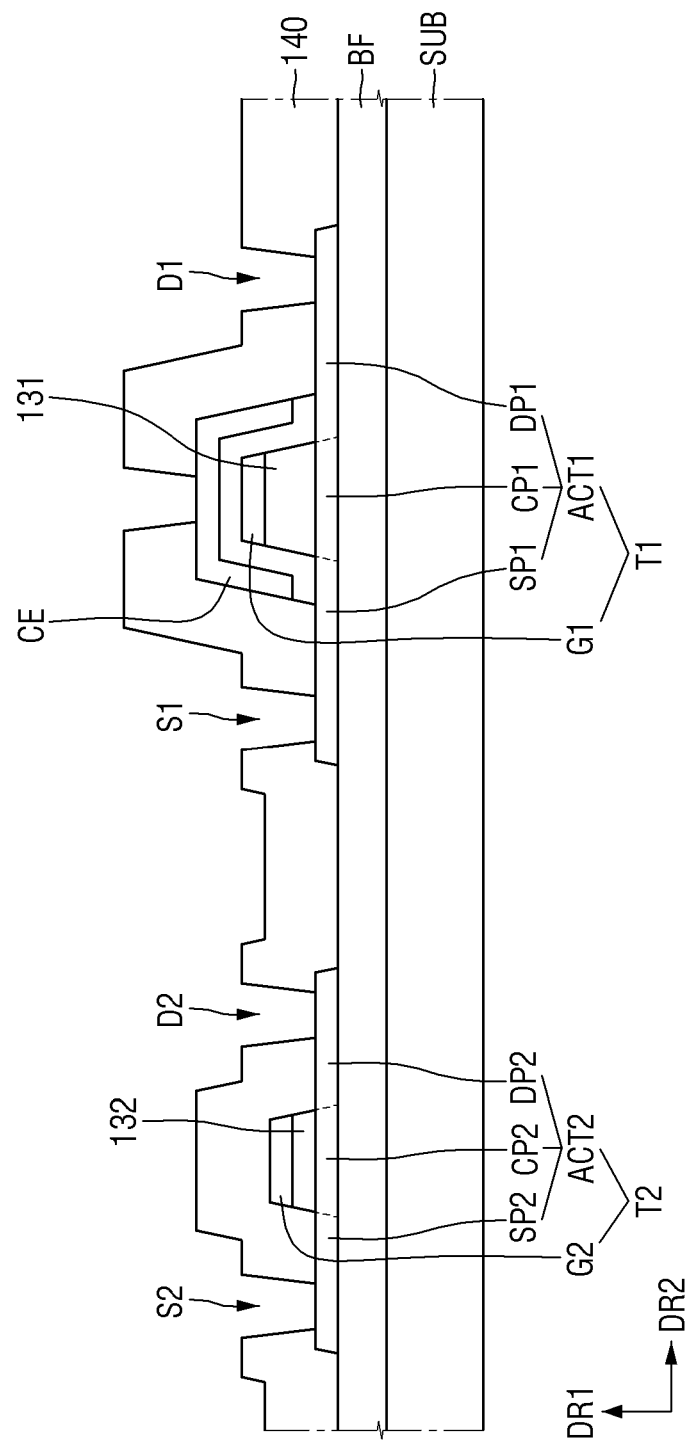

Fourthly, as shown in FIG. 19, an interlayer dielectric layer 140 is formed on the second gate electrode G2 of the second transistor T2 and the capacitor electrode CE, and contact holes CT1, CT2, CT3, CT4 and CT5 are formed in the interlayer dielectric layer 140 (step S104 in FIG. 9).

For example, as shown in FIG. 19, the interlayer dielectric layer 140 is formed on the second gate electrode G2 of the second transistor T2 and the capacitor electrode CE. In addition, the interlayer dielectric layer 140 is formed on side surfaces of the second gate insulating layer 132. In addition, the interlayer dielectric layer 140 is formed on the first active layer ACT1 and the second active layer ACT2 not covered by the second gate insulating layer 132. In addition, the interlayer dielectric layer 140 may be formed on the buffer layer BF not covered by the first active layer ACT1 and the second active layer ACT2. The interlayer dielectric layer 140 may be formed as an inorganic layer, for example, a silicon oxide layer. The interlayer dielectric layer 140 may be formed by a PECVD technique.

Subsequently, a photoresist pattern may be formed on the interlayer dielectric layer 140. Subsequently, the interlayer dielectric layer 140 may be etched to form contact holes CT1, CT2, CT3, CT4 and CT5, and the photoresist pattern PR2 may be removed via a stripping process.

The first contact hole CT1 may be a hole penetrating through the interlayer dielectric layer 140 to expose the first source region SP1 of the first active layer ACT1. The second contact hole CT2 may be a hole that penetrates through the interlayer dielectric layer 140 to expose the first drain region DP1 of the first active layer ACT1. The third contact hole CT3 may be a hole that penetrates through the interlayer dielectric layer 140 to expose the capacitor electrode CE. The fourth contact hole CT4 may be a hole that penetrates through the interlayer dielectric layer 140 to expose the second source region SP2 of the second active layer ACT2. The fifth contact hole CT5 may be a hole that penetrates through the interlayer dielectric layer 140 to expose the second drain region DP2 of the second active layer ACT2.

Figure 20:
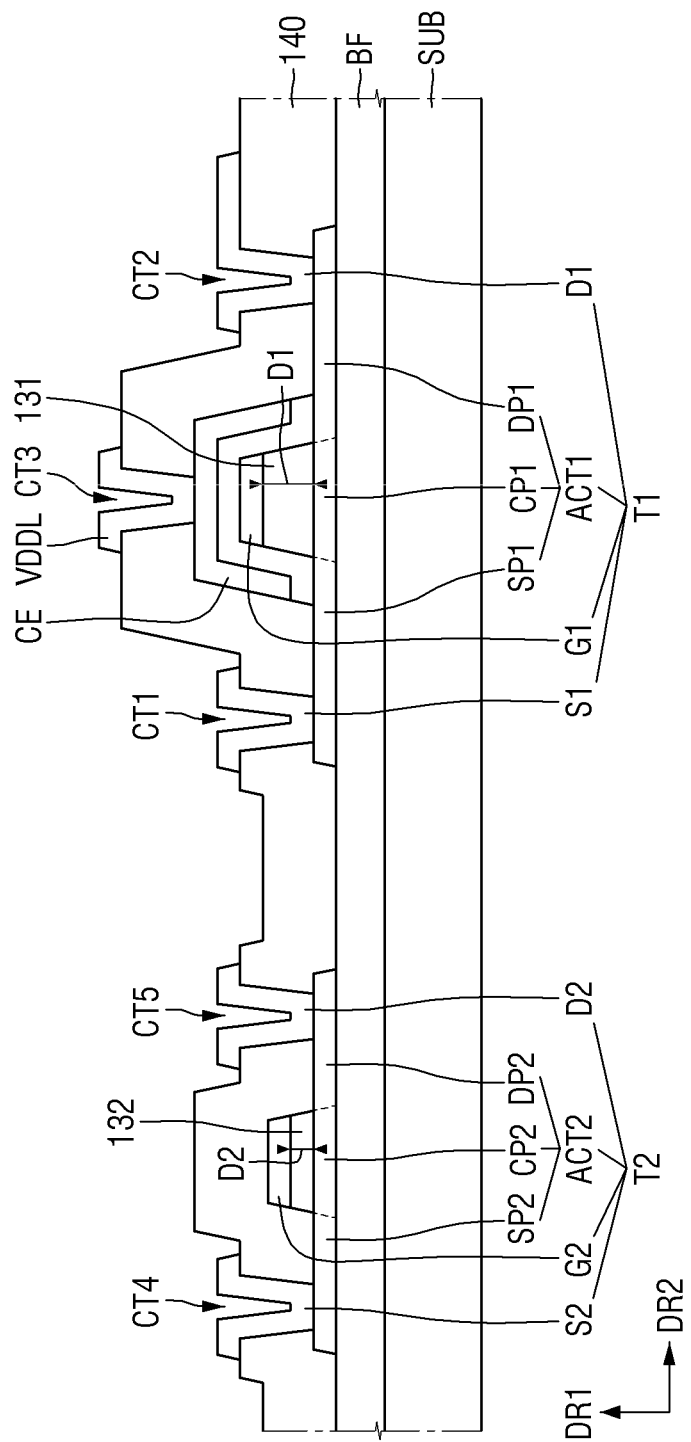

Fifthly, as shown in FIG. 20, a first source electrode S1 and a first drain electrode D1 of a first transistor T1, a second source electrode S2 and a second drain electrode D2 of a second transistor T2, and a first supply voltage line VDDL may be formed on the interlayer dielectric layer 140 (step S105 of FIG. 9).

For example, a source-drain metal layer SDM is formed on the interlayer dielectric layer 140. A source-drain metal layer SDM may be made up of a single layer or multiple layers of one of molybdenum (Mo), aluminum (Al), chromium (Cr), gold (Au), titanium (Ti), nickel (Ni), neodymium (Nd), and copper (Cu) or an alloy thereof. The source-drain metal layer SDM may be formed by using sputtering or MOCVD technique.

Subsequently, a photoresist pattern may be formed on the source-drain metal layer SDM. The source-drain metal layer SDM not covered by the photoresist pattern is etched to form the first source electrode S1, the first drain electrode D1, the second source electrode S2, the second drain electrode D2 and the first supply voltage line VDDL, and the photoresist pattern may be removed via a stripping process. The first source electrode S1 may be connected to the first source region SP1 through the first contact hole CT1. The first drain electrode D1 may be connected to the first drain region DP1 through the second contact hole CT2. The first supply voltage line VDDL may be connected to the capacitor electrode CE through the third contact hole CT3. The second source electrode S2 may be connected to the second source region SP2 through the fourth contact hole CT4. The second drain electrode D2 may be connected to the second drain region DP2 through the fifth contact hole CT5.

Figure 21:
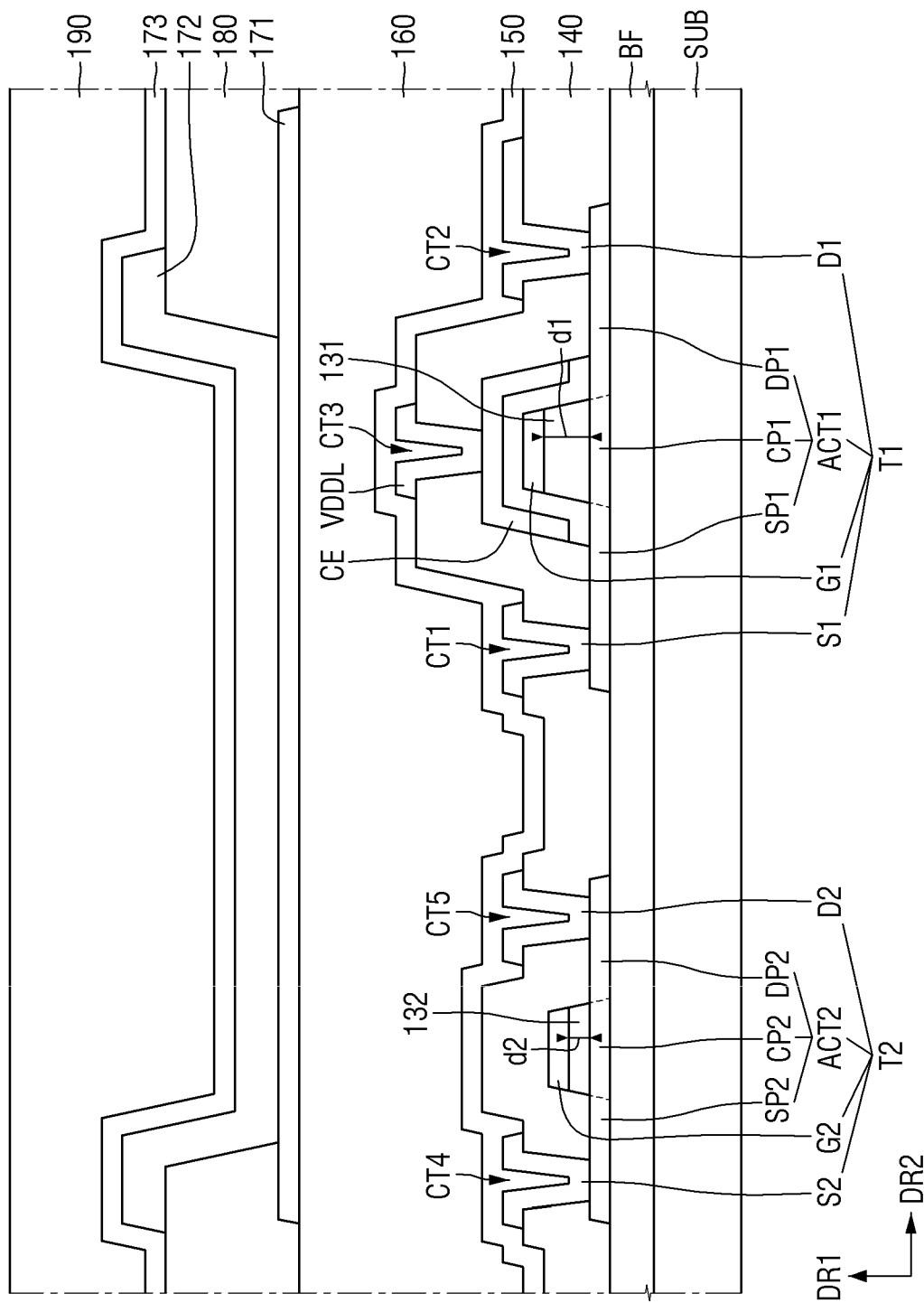

Sixthly, as shown in FIG. 21, a passivation layer 150 and a planarization layer 160 are formed, a first electrode 171, a bank layer 180, an emissive layer 172 and a second electrode 173 are formed on the planarization layer 160, and an encapsulation layer 190 is formed on the second electrode 173 (step S106 in FIG. 9).

For example, as shown in FIG. 21, the passivation layer 150 may be formed on the first source electrode S1, the first drain electrode D1, the second source electrode S2, the second drain electrode D2 and the first supply voltage line VDDL. In addition, the passivation layer 150 may be formed on a pr of the interlayer dielectric layer 140 that is not covered by the first source electrode S1, the first drain electrode D1, the second source electrode S2, the second drain electrode D2 and the first supply voltage line VDDL. The passivation layer 150 may be formed by a PECVD technique.

Subsequently, the planarization layer 160 is formed on the passivation layer 150, and a sixth contact hole CT6 is formed through the planarization layer 160 and the passivation layer 150 to expose the first drain electrode D1.

Subsequently, a first metal layer ML1 is formed on the planarization layer 160. In a top-emission structure, the first metal layer ML1 may be formed as a stack structure of aluminum and titanium (Ti/Al/Ti), a stack structure of aluminum and ITO (ITO/Al/ITO), an APC alloy and a stack structure of an APC alloy and ITO (ITO/APC/ITO). Alternatively, the first metal layer ML1 may be made up of a single layer of molybdenum (Mo), titanium (Ti), copper (Cu), or aluminum (Al). The first metal layer ML1 may be formed by using sputtering or MOCVD technique.

Subsequently, a photoresist pattern may be formed on the first metal layer ML1. The first electrode 171 may be formed by etching the first metal layer ML1 not covered by the photoresist pattern. The first electrode 171 may be connected to the fifth drain electrode of the fifth transistor T5 through the sixth contact hole.

Subsequently, the bank layer 180 may be formed to cover the edge of the first electrode 171.

Subsequently, the emissive layer 172 may be formed on the first electrode 171 which is not covered by the bank layer 180 and the bank layer 180. The emissive layer 172 may include a hole transporting layer, an organic material layer, and an electron transporting layer.

Subsequently, the second electrode 173 may be formed on the emissive layer 172.

Subsequently, an encapsulation layer 190 may be formed on the second electrode 173. The encapsulation layer 190 may include at least one inorganic layer to prevent or reduce oxygen, moisture, or other contaminants from permeating into the emissive layer 172 and the second electrode 173. In addition, the encapsulation layer 190 may include at least one organic layer to protect the emissive layer 172 from foreign substances such as dust.

Alternatively, a substrate may be located on the second electrode 173 instead of the encapsulation layer 190, such that the space between the second electrode and the substrate may be empty in vacuum state or a filler film may be arranged therein. The filler film may be an epoxy filler film or a silicon filler film.

Figure 22:
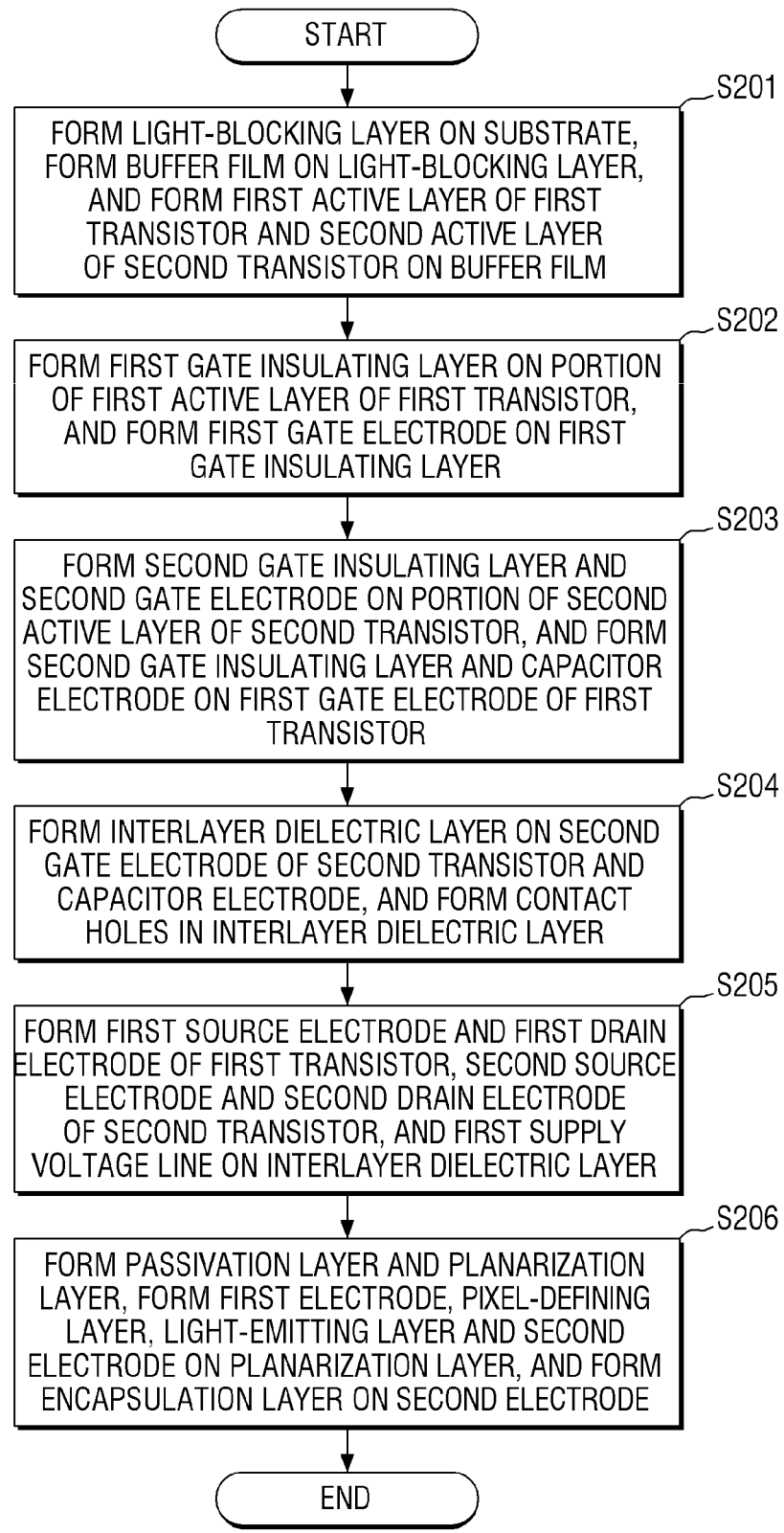
FIG. 22 is a flowchart for illustrating a method of fabricating a display device according to some example embodiments of the present disclosure.
Figure 23:
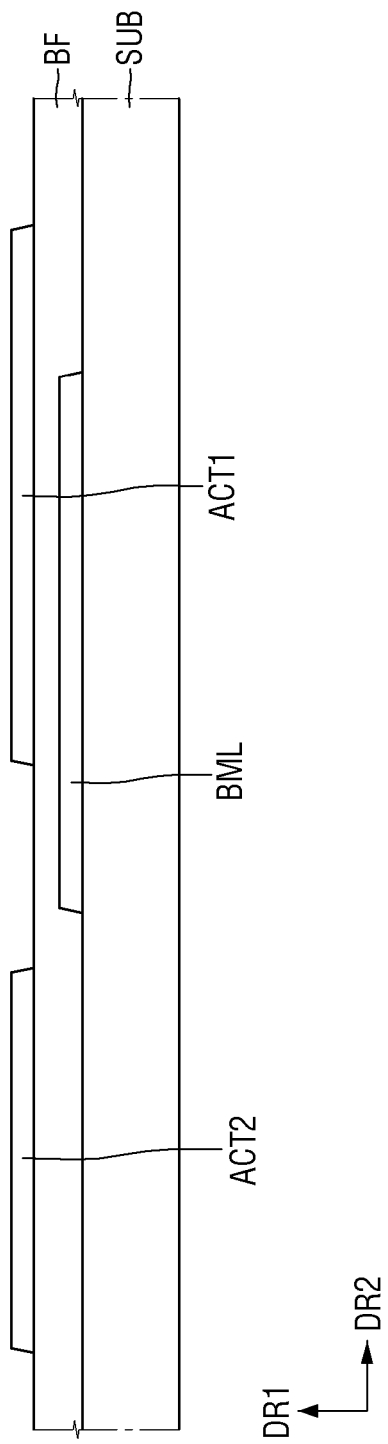
FIGS. 23 to 25 are cross-sectional views of a first transistor and a second transistor in the operations S201, S204, and S205 of FIG. 22.
Figure 24:
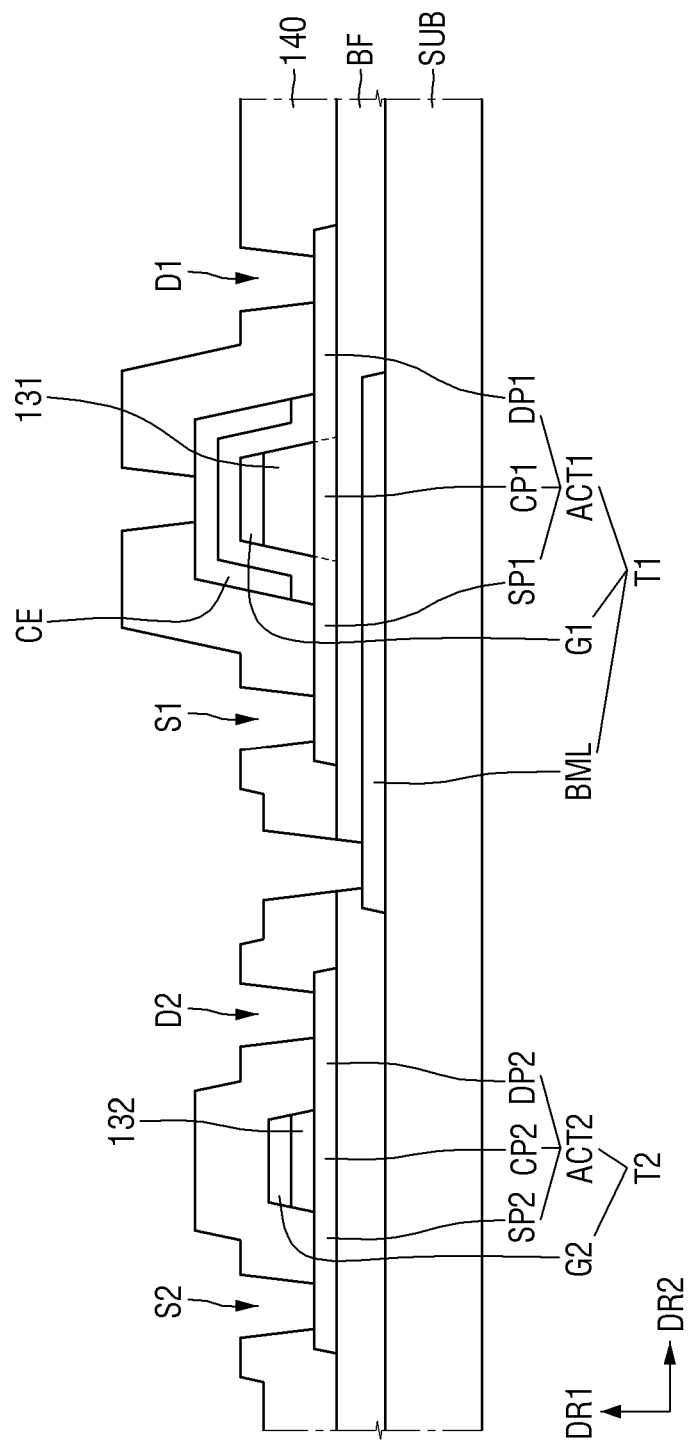
Figure 25:
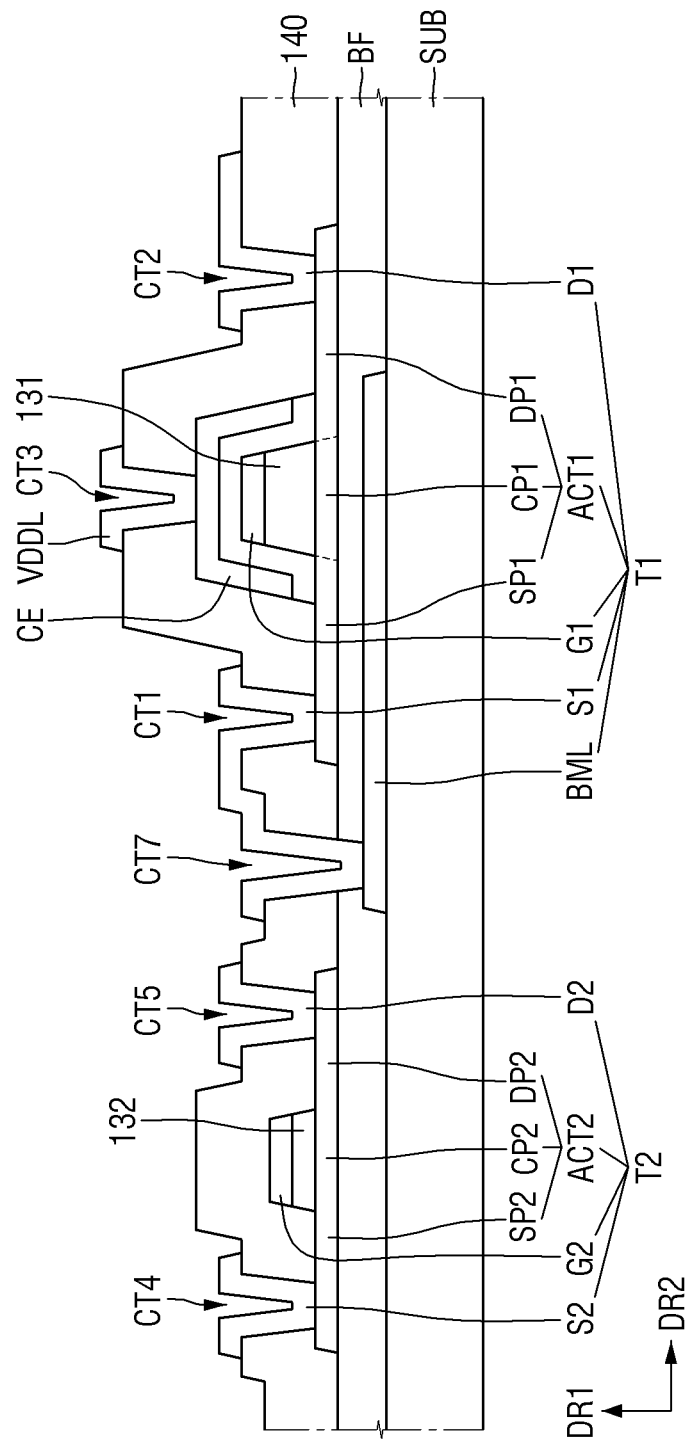

FIG. 22 is a flowchart for illustrating a method of fabricating a display device according to some example embodiments of the present disclosure. FIGS. 23 to 25 are cross-sectional views of a first transistor and a second transistor in the steps S201, S204, and S205 of FIG. 22.

Hereinafter, a method of fabricating a display device according to some example embodiments will be described in more detail with reference to FIGS. 22 to 25.

Firstly, as shown in FIG. 23, a light shielding layer BML is formed on a substrate SUB, a buffer layer BF is formed on the light shielding layer BML, and a first active layer ACT1 of a first transistor T1 and a second active layer ACT2 of a second transistor T2 are formed on the buffer layer BF (step S201 in FIG. 22).

For example, a light shielding material layer BML' may be formed on a substrate SUB. The light shielding material layer BML' may be made up of a single layer or multiple layers of one of molybdenum (Mo), aluminum (Al), chromium (Cr), gold (Au), titanium (Ti), nickel (Ni), neodymium (Nd), and copper (Cu) or an alloy thereof. The first gate metal layer GM1 may be formed by using sputtering or MOCVD technique.

Subsequently, a photoresist pattern may be formed on the light shielding material layer BML', and the light shielding material layer BML' which is not covered by the photoresist pattern may be etched to form the light shielding layer BML.

Subsequently, the buffer layer BF may be formed on the light shielding layer BML. The buffer layer BF may be formed on the substrate SUB not covered by the light shielding layer BML.

The process of forming the first active layer ACT1 of the first transistor T1 and the second active layer ACT2 of the second transistor T2 on the buffer layer BF in step S201 of FIG. 22 is substantially identical to step S101 of FIG. 9; and, therefore, the redundant description will be omitted.

In addition, operations S201, S202 and S203 of FIG. 22 are substantially identical to operations S201, S202 and S203 of FIG. 9; and, therefore, some redundant description may be omitted.

Fourthly, as shown in FIG. 24, an interlayer dielectric layer 140 is formed on the second gate electrode G2 of the second transistor T2 and the capacitor electrode CE, and contact holes CT1, CT2, CT3, CT4, CT5 and CT7 are formed in the interlayer dielectric layer 140 (step S204 in FIG. 22).

Operation S204 of FIG. 22 is substantially identical to the operation S104 of FIG. 9 except for the seventh contact hole CT7.

The seventh contact hole CT7 may be a hole that penetrates through the interlayer dielectric layer 140 and the buffer film BF to expose the light shielding layer BML.

Fifthly, as shown in FIG. 25, a first source electrode S1 and a first drain electrode D1 of a first transistor T1, a second source electrode S2 and a second drain electrode D2 of a second transistor T2, and a first supply voltage line VDDL may be formed on the interlayer dielectric layer 140 (operation S205 of FIG. 22).

The operation S205 of FIG. 22 is substantially identical to operation S105 of FIG. 9; and, therefore, some redundant description will be omitted.

In addition, operation S206 of FIG. 22 is substantially identical to the operation S106 of FIG. 9; and, therefore, some redundant description will be omitted.

Although aspects of some example embodiments of the present disclosure have been disclosed for illustrative purposes, those skilled in the art will appreciate that various modifications, additions and substitutions are possible, without departing from the scope and spirit of embodiments according to the present disclosure as defined by the accompanying claims and equivalents thereof.

What is claimed is:
1. A display device comprising:
a substrate;
a first active layer of a first transistor and a second active layer of a second transistor on the substrate;
a first gate insulating layer on the first active layer;
a first gate electrode on the first gate insulating layer;

a second gate insulating layer on the second active layer; and a second gate electrode on the second gate insulating layer, wherein a hydrogen concentration of each layer of material between the first gate electrode and the first active layer, including the first gate insulating layer, is lower than a hydrogen concentration of the second gate insulating layer.

2. The display device of claim 1, wherein a minimum thickness of the first gate insulating layer is greater than a minimum thickness of the second gate insulating layer.

3. The display device of claim 1, wherein the second gate insulating layer is on the first gate electrode.

4. The display device of claim 3, wherein the second gate insulating layer is on an upper surface and side surfaces of the first gate electrode.

5. The display device of claim 3, wherein the second gate insulating layer is on side surfaces of the first gate insulating layer.

6. The display device of claim 3, further comprising:
a capacitor electrode on the second gate insulating layer and overlapping with the first gate electrode in a first direction that is a thickness direction of the substrate.

7. The display device of claim 6, wherein the capacitor electrode is on an upper surface of the second gate insulating layer, and is in a portion of each of side surfaces of the second gate insulating layer.

8. The display device of claim 7, wherein the capacitor electrode overlaps with the first gate electrode in a second direction intersecting the first direction.

9. The display device of claim 6, wherein the first active layer comprises a first channel region, a first source region on a first side of the first channel region, and a first drain region on a second side of the first channel region.

10. The display of claim 9, wherein the first gate insulating layer is on the first channel region, and the second gate insulating layer is on a portion of the first source region and a portion of the first drain region.

11. The display device of claim 9, further comprising:
an interlayer dielectric layer on the capacitor electrode;
a first source electrode on the interlayer dielectric layer and connected to another portion of the first source region through a first contact hole penetrating through the interlayer dielectric layer; and
a first drain electrode on the interlayer dielectric layer and connected to another portion of the first drain region through a second contact hole penetrating through the interlayer dielectric layer.

12. The display device of claim 11, further comprising:
a light shielding layer on the substrate and overlapping with the first channel region in the first direction; and
a buffer layer between the light shielding layer and the first active layer,
wherein the first source electrode is connected to the light shielding layer through a contact hole penetrating through the interlayer dielectric layer and the buffer layer.

13. The display device of claim 11, further comprising:
a supply voltage line on the interlayer dielectric layer and connected to the capacitor electrode through a third contact hole penetrating through the interlayer dielectric layer.

14. The display device of claim 9, wherein the second active layer comprises a second channel region, a second source region on one side of the second channel region, and a second drain region on an opposite side of the second channel region.

15. The display device of claim 14, wherein the second gate insulating layer is on the second channel region.

16. The display device of claim 14, further comprising:
an interlayer dielectric layer on the second gate electrode;
a second source electrode on the interlayer dielectric layer and connected to another portion of the second source region through a fourth contact hole penetrating through the interlayer dielectric layer; and
a second drain electrode on the interlayer dielectric layer and connected to another portion of the second drain region through a fifth contact hole penetrating through the interlayer dielectric layer.

17. The display device of claim 1, wherein the first gate insulating layer and the second gate insulating layer comprise a silicon oxide layer.

18. The display device of claim 1, wherein the first active layer and the second active layer are formed of an oxide semiconductor comprising indium, gallium, and oxygen.

19. A method of fabricating a display device, the method comprising:
forming a first active layer of a first transistor and a second active layer of a second transistor on a substrate;
forming a first gate insulating layer on a first channel region of the first active layer, and a first gate electrode of the first transistor on the first gate insulating layer, the first gate electrode overlapping the first channel region in a first direction that is a thickness direction of the substrate; and
forming a second gate insulating layer on a second channel region of the second active layer, and a second gate electrode of the second transistor on the second gate insulating layer, the second gate electrode overlapping the second channel region in the first direction,
wherein a hydrogen concentration of each layer of material between the first gate electrode and the first active layer, including the first gate insulating layer is lower than a hydrogen concentration of the second gate insulating layer.

20. The method of claim 19, wherein a minimum thickness of the first gate insulating layer is greater than a minimum thickness of the second gate insulating layer.

21. The method of claim 19, wherein the forming the second gate electrode of the second transistor on the second gate insulating layer comprises:
forming a capacitor electrode on the second gate insulating layer such that it overlaps with the first gate electrode in the first direction.

22. The method of claim 21, wherein the capacitor electrode overlaps with the first gate electrode in a second direction intersecting the first direction.

* * * * *